US012733377B2

(12) United States Patent
Zhang et al.

(10) Patent No.: US 12,733,377 B2
(45) Date of Patent: Sep. 8, 2026

(54) DISPLAY PANEL AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bo Zhang, Beijing (CN); Zhiwen Chu, Beijing (CN); Yi Qu, Beijing (CN); Xinxin Wang, Beijing (CN); Aoyuan Feng, Beijing (CN); Hongwei Ma, Beijing (CN); Ying Liu, Beijing (CN); Xin Jin, Beijing (CN); Lei Fan, Beijing (CN); Jianbo Yang, Beijing (CN); Xiaoliang Guo, Beijing (CN); Lei Deng, Beijing (CN); Chunfang Fan, Beijing (CN); Fei Liu, Beijing (CN); Liangyun Li, Beijing (CN); Qinbo Ren, Beijing (CN); Yingchang Gao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 375 days.

(21) Appl. No.: 18/284,745

(22) PCT Filed: Feb. 20, 2023

(86) PCT No.: PCT/CN2023/077150

§ 371 (c)(1),
(2) Date: Sep. 28, 2023

(87) PCT Pub. No.: WO2023/169192

PCT Pub. Date: Sep. 14, 2023

(65) Prior Publication Data

US 2024/0188390 A1 Jun. 6, 2024

(30) Foreign Application Priority Data

Mar. 7, 2022 (CN) ........................ 202210224650.9

(51) Int. Cl.
*H10K 59/80* (2023.01)
*H10K 59/122* (2023.01)
(Continued)

(52) U.S. Cl.
CPC ......... *H10K 59/873* (2023.02); *H10K 59/122* (2023.02); *H10K 59/131* (2023.02); *H10K 59/40* (2023.02); *H10K 59/80524* (2023.02)

(58) Field of Classification Search
CPC ............... H10K 50/842; H10K 59/873; H10K 59/80524; H10K 59/131; H10K 50/80;
(Continued)

(56) References Cited

U.S. PATENT DOCUMENTS 10,347,866 B1 * 7/2019 Kim ...................... H10K 59/88
2006/0113900 A1 6/2006 Oh
(Continued)

FOREIGN PATENT DOCUMENTS

CN 108962947 A 12/2018
CN 110880524 A 3/2020
(Continued)

OTHER PUBLICATIONS

PCT International Search Report (w/ English translation) and Written Opinion for corresponding PCT Application No. PCT/CN2023/077150, dated May 22, 2023, 10 pages.
(Continued)

*Primary Examiner* — Mouloucoulaye Inoussa
(74) *Attorney, Agent, or Firm* — Dority & Manning, P.A.

(57) ABSTRACT

A display panel has a display region and a peripheral region. The display panel includes a substrate, a first metal layer
(Continued)

disposed on the substrate, a planarization layer disposed on a side of the first metal layer away from the substrate, and a retaining wall structure located in the peripheral region and surrounding the display region. The first metal layer includes a signal line pattern located in the peripheral region. The planarization layer includes an opening in the peripheral region. At least a portion of the retaining wall structure is located in the opening. The signal line pattern is provided with at least one through hole, an orthogonal projection of the at least one through hole on the substrate is located within an orthogonal projection of the opening on the substrate, and is at least located on a side of an orthogonal projection of the retaining wall structure on the substrate.

20 Claims, 14 Drawing Sheets

(51) Int. Cl.
*H10K 59/131* (2023.01)
*H10K 59/40* (2023.01)

(58) Field of Classification Search
CPC .. H10K 59/40; H10K 59/122; H10K 59/8722; H10K 59/8731; H10K 59/124; H10K 77/111; H10K 59/121; H10K 59/871; H10K 2102/00; H10K 2102/311; G06F 3/0446; G06F 3/0448; G06F 3/0445; G06F 3/0443; G06F 2203/04112; G06F 2203/04103; G09F 9/301; G02F 1/133305; Y02E 10/549
See application file for complete search history.

(56) References Cited

U.S. PATENT DOCUMENTS

2015/0228927 A1* 8/2015 Kim ..................... H10K 59/875 257/40
2016/0079564 A1* 3/2016 Shim .................. H10K 50/8445 257/40
2016/0307971 A1* 10/2016 Jeon ........................ H01L 22/30
2017/0279079 A1 9/2017 Kim et al.
2017/0323936 A1* 11/2017 Lee .................... H10K 59/8731
2018/0026226 A1* 1/2018 Choi .................... H10K 59/873 257/552
2018/0090698 A1* 3/2018 Jeong ................... H10K 59/873
2018/0102502 A1* 4/2018 Kim ................... H10K 59/8731
2018/0122890 A1 5/2018 Park et al.
2019/0057632 A1* 2/2019 Kim ..................... G09G 3/3266
2019/0214446 A1* 7/2019 Kim ....................... H10K 71/00
2020/0136087 A1* 4/2020 Kim ................... H10K 59/8731
2021/0020078 A1* 1/2021 Park ................... H10K 59/8731
2021/0043715 A1* 2/2021 Han ....................... H10K 59/40
2021/0066419 A1* 3/2021 Byun ................... H10K 59/122
2021/0074796 A1 3/2021 Mao et al.
2021/0091320 A1* 3/2021 Choi ..................... G06F 1/1626
2021/0098525 A1* 4/2021 Bang .................. H10K 59/8722
2021/0111371 A1* 4/2021 Cho ..................... H10K 59/121
2021/0173446 A1* 6/2021 Bang ..................... G06F 1/1652
2021/0200361 A1* 7/2021 Park ....................... H10K 59/40
2021/0202664 A1* 7/2021 Kim ....................... H10K 59/35
2021/0217835 A1* 7/2021 Park ..................... H10K 50/844
2021/0225992 A1 7/2021 Long et al.
2021/0225994 A1 7/2021 Long et al.
2021/0242423 A1* 8/2021 Lee ...................... H10K 50/865
2021/0257577 A1* 8/2021 Bang ...................... H10K 59/40
2021/0265436 A1 8/2021 Jeon et al.
2021/0294447 A1* 9/2021 Park .................... G06F 3/04164
2021/0313414 A1* 10/2021 Park ..................... H10K 59/131
2021/0320164 A1* 10/2021 Lee ...................... H10K 59/121
2021/0376037 A1* 12/2021 You .................... H10K 59/8052
2021/0384466 A1 12/2021 Liu et al.
2022/0020833 A1* 1/2022 Cho ....................... H10K 59/40
2022/0102689 A1* 3/2022 Jiang .................... H10K 59/873
2022/0115625 A1* 4/2022 Yu ......................... H10K 59/131
2022/0131113 A1* 4/2022 Jung .................... H10K 77/111
2022/0158139 A1* 5/2022 Kim ...................... G09F 9/3026
2022/0254862 A1* 8/2022 Lhee ...................... H10K 59/88
2022/0263046 A1* 8/2022 Lee ........................ H10K 59/88
2022/0263049 A1* 8/2022 Lee ...................... H10K 50/822
2022/0285647 A1* 9/2022 Cho ..................... H10K 59/122
2022/0397997 A1* 12/2022 Park ...................... G06F 3/0412
2023/0071490 A1* 3/2023 Kim ..................... H10K 59/126
2023/0209892 A1* 6/2023 Kim ......................... G09G 3/32 257/40
2023/0217687 A1* 7/2023 Jung .................... H10K 50/858 257/40
2023/0345764 A1* 10/2023 Lee .................... H10K 59/1213

FOREIGN PATENT DOCUMENTS

CN 112310181 A 2/2021
CN 113517305 A 10/2021
CN 114122021 A 3/2022
CN 217903125 U 11/2022

OTHER PUBLICATIONS

First Office Action (with English translation) received in corresponding Application No. CN 202210224650.9, dated May 9, 2025, 20 pages.

* cited by examiner

A-A

DISPLAY PANEL AND DISPLAY APPARATUS

CROSS-REFERENCE TO RELATED APPLICATIONS

This application is a national phase entry under 35 USC 371 of International Patent Application No. PCT/CN2023/077150, filed on Feb. 20, 2023, which claims priority to Chinese Patent Application No. 202210224650.9, filed on Mar. 7, 2022, which are incorporated herein by reference in their entirety.

TECHNICAL FIELD

The present disclosure relates to the field of display technologies, and in particular, to a display panel and a display apparatus.

BACKGROUND

With the development of display technology, organic light-emitting diode (OLED) display panels have been widely used due to their characteristics of self-illumination, wide viewing angle, high contrast, fast response, low power consumption, and ultra-lightness and ultra-thinness.

OLED display panels use organic materials. However, the organic materials will undergo irreversible photo oxidation reactions in the presence of moisture and oxygen. In addition, moisture and oxygen also have a strong corrosive effect on electrode materials such as aluminum, magnesium or silver. Therefore, the barrier effect of the display panel on moisture and oxygen will directly affect reliability and service life of the display panel. How to improve an encapsulation effect of the display panel is an urgent problem to be solved for the OLED display panel.

SUMMARY

In an aspect, a display panel is provided. The display panel has a display region and a peripheral region surrounding the display region. The display panel includes a substrate, a first metal layer, a planarization layer and a retaining wall structure. The first metal layer is disposed on the substrate, and the first metal layer includes a signal line pattern located in the peripheral region. The planarization layer is disposed on a side of the first metal layer away from the substrate. The planarization layer includes at least one opening located in the peripheral region. The retaining wall structure is located in the peripheral region and surrounds the display region. At least a portion of the retaining wall structure is located in the at least one opening. The signal line pattern is provided with one or more through holes therein, and an orthogonal projection of the one or more through holes on the substrate is located within an orthogonal projection of the opening on the substrate, and is located on at least one of a side of an orthogonal projection of the retaining wall structure on the substrate proximate to the display region or a side of the orthogonal projection of the retaining wall structure on the substrate away from the display region.

In some embodiments, the signal line pattern is provided with a plurality of through holes therein, the plurality of through holes are arranged in one or more rows, and multiple through holes in a row are distributed in an extending direction of the portion of the retaining wall structure located in the opening at intervals.

In some embodiments, at least one row of the one or more rows of through holes are disposed on a side of the retaining wall structure proximate to the display region; and/or at least one row of the one or more rows of through holes are disposed on a side of the retaining wall structure away from the display region.

In some embodiments, the plurality of through holes are arranged in a plurality of rows, and in a direction perpendicular to an arrangement direction of a row of through holes, any two adjacent rows of through holes are distributed at intervals.

In some embodiments, the opening includes a first edge and a second edge opposite to each other, the first edge is located on a side of the retaining wall structure proximate to the display region, and the second edge is located on a side of the retaining wall structure away from the display region. At least one through hole in the one or more through holes is disposed between the retaining wall structure and the first edge. At least one through hole in the one or more through holes is disposed between the retaining wall structure and the second edge.

In some embodiments, a distance between the retaining wall structure and the first edge is smaller than a distance between the retaining wall structure and the second edge.

In some embodiments, the opening includes a first edge, and the first edge is located on a side of the retaining wall structure proximate to the display region. At least one through hole in the one or more through holes is disposed between the retaining wall structure and the first edge, and a distance between the at least one through hole and the retaining wall structure is in a range of 11 μm to 40 μm, inclusive.

In some embodiments, the opening includes a second edge, and the second edge is located on a side of the retaining wall structure away from the display region. At least one through hole in the one or more through holes is disposed between the retaining wall structure and the second edge, and a distance between the at least one through hole and the retaining wall structure is in a range of 11 μm to 75 μm, inclusive.

In some embodiments, the opening includes a first edge and a second edge, the first edge is located on a side of the retaining wall structure proximate to the display region, and the second edge is located on a side of the retaining wall structure away from the display region. At least one through hole in the one or more through holes is disposed between the retaining wall structure and the first edge, and a minimum distance between the at least one through hole and the first edge is approximately equal to a minimum distance between the through hole and the retaining wall structure. And/or, at least one through hole in the one or more through holes is disposed between the retaining wall structure and the second edge, and a minimum distance between the at least one through hole and the second edge is approximately equal to a minimum distance between the through hole and the retaining wall structure.

In some embodiments, a shape of an orthogonal projection of a through hole on the substrate is a circle or a rectangle.

In some embodiments, an area of a sidewall of each through hole in the one or more through holes is in a range of 40 $\mu m^2$ to 100 $\mu m^2$, inclusive.

In some embodiments, the sidewall of each through hole includes an undercut, a bottom wall of the undercut is substantially arc-shaped, and a maximum distance between a lowest point of the bottom wall and the sidewall of the through hole is inversely related to a number of the one or more through holes.

In some embodiments, the opening includes a first edge and a second edge opposite to each other, the first edge is located on a side of the retaining wall structure proximate to the display region, and the second edge is located on a side of the retaining wall structure away from the display region. At least one first through hole in the one or more through holes is disposed between the retaining wall structure and the first edge, and at least one second through hole in the one or more through holes is disposed between the retaining wall structure and the second edge. A number of the at least one first through hole is less than a number of the at least one second through hole, and an average depth of an undercut in a sidewall of a first through hole is less than an average depth of an undercut in a sidewall of a second through hole. Alternatively, the number of the at least one second through hole is less than the number of the at least one first through hole, and the average depth of the undercut in the sidewall of the second through hole is less than the average depth of the undercut in the sidewall of the first through hole. Alternatively, the number of the at least one first through hole is equal to the number of the at least one second through hole, and the average depth of the undercut in the sidewall of the first through hole is approximately equal to the average depth of the undercut in the sidewall of the second through hole.

In some embodiments, a sidewall of the at least one through hole includes an undercut. The more a number of the through hole(s), the smaller an average depth of each through hole, or the smaller an average depth recessed by the undercut.

In some embodiments, the first metal layer includes at least one voltage signal line, a portion of the at least one voltage signal line is disposed in the peripheral region and located in the at least one opening, and the one or more through holes are disposed in the portion of the at least one voltage signal line located in the peripheral region and located in the at least one opening.

In some embodiments, the peripheral region includes a fan-out area located on a side of the display region, and a bonding area located on a side of the fan-out area away from the display region. The at least one voltage signal line includes a first voltage signal line and a second voltage signal line. The first voltage signal line includes a plurality of first sub-lines disposed in the display region, a first bus located in the fan-out area, and a first connection line extending from the fan-out area to the bonding area. Ends of the plurality of first sub-lines proximate to the fan-out area are electrically connected to the first bus, and the first bus is electrically connected to the first connection line. The second voltage signal line includes a second sub-line disposed in the peripheral region and at least partially surrounding the display region, at least one second bus located in the fan-out area, and at least one second connection line extending from the fan-out area to the bonding area. Both ends of the second sub-line extend to the fan-out area and are electrically connected to the at least one second bus, and the at least one second bus is electrically connected to the at least one second connection line. The first bus and the at least one second bus extend in a first direction, and the first direction is an extension direction of a side edge of the display region where the fan-out area is located. The signal line pattern includes the first bus and the at least one second bus, and the one or more through holes are disposed in the first bus and/or the at least one second bus.

In some embodiments, multiple through holes are disposed in the first bus, and the multiple through holes are arranged in a row in the first direction.

In some embodiments, the second voltage signal line includes two second buses, and the two buses are located on both sides of the fan-out area. Each second bus is electrically connected to an end of the second sub-line extending to a same side of the fan-out area as the second bus. Multiple through holes are disposed in at least one second bus, and the multiple through holes are arranged in a row in the first direction.

In some embodiments, the first metal layer includes a metal titanium layer, a metal aluminum layer and a metal titanium layer that are stacked in sequence.

In some embodiments, the retaining wall structure includes a first retaining wall and a second retaining wall that are disposed at intervals, and the first retaining wall is closer to the display region than the second retaining wall. The one or more through holes are disposed on a side of the first retaining wall proximate to the display region and/or on a side of the second retaining wall away from the display region.

In some embodiments, the first retaining wall and the second retaining wall each include a spacer block, and the spacer block is located in the planarization layer.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
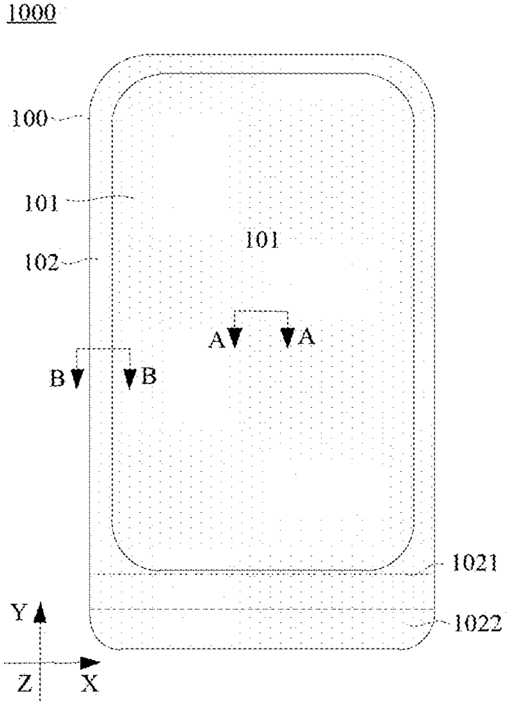
FIG. 1 is a structural diagram of a display panel, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

The phrase "A and/or B" includes the following three combinations: only A, only B, and a combination of A and B.

The phrase "applicable to" or "configured to" as used herein indicates an open and inclusive expression, which does not exclude apparatuses that are applicable to or configured to perform additional tasks or steps.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display apparatus 1000. Referring to FIG. 1, the display apparatus 1000 may be any product or component having a display function, such as a television, a notebook computer, a tablet computer, a mobile phone, a personal digital assistant (PDA), a navigator, a wearable device, an augmented reality (AR) device, or a virtual reality (VR) device.

The display apparatus includes a display panel 100. The display panel 100 has a display region 101 and a peripheral region 102 surrounding the display region 101. The peripheral region 102 includes a fan-out area 1021 and a bonding area 1022 that are located on a side of the display region 101, and the bonding area 1022 is located on a side of the fan-out area 1021 away from the display region 101.

It will be understood that, in some embodiments, the peripheral region 102 may be located only on one or more sides of the display region 101, which is not specifically limited in the embodiments of the present disclosure.

The display region 101 includes a plurality of sub-pixels, and each sub-pixel includes a pixel driving circuit 110 on a substrate 11 and a light-emitting device 20 electrically connected to the pixel driving circuit 110. The peripheral region 102 includes a plurality of signal lines, integrated circuit (IC) chip(s) and the like. The IC chip is disposed in the bonding area 1022 in the peripheral region 102.

Figure 2A:
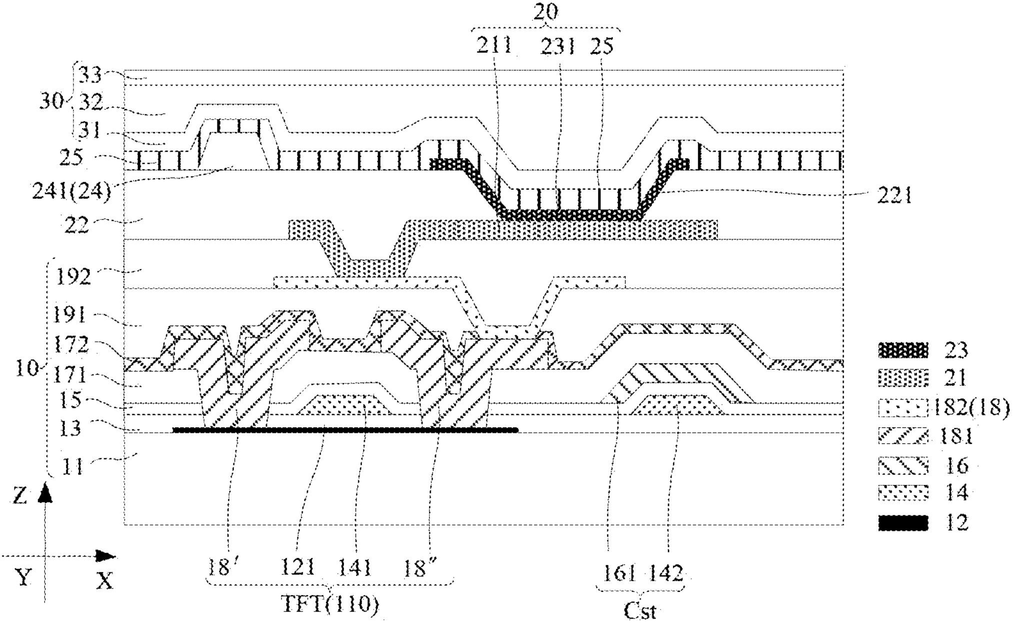
FIG. 2A is a schematic diagram of a structure taken along a section line A-A in FIG. 1.
Figure 2B:
FIG. 2B is a schematic diagram of another structure taken along a section line A-A in FIG. 1.
Figure 2B:
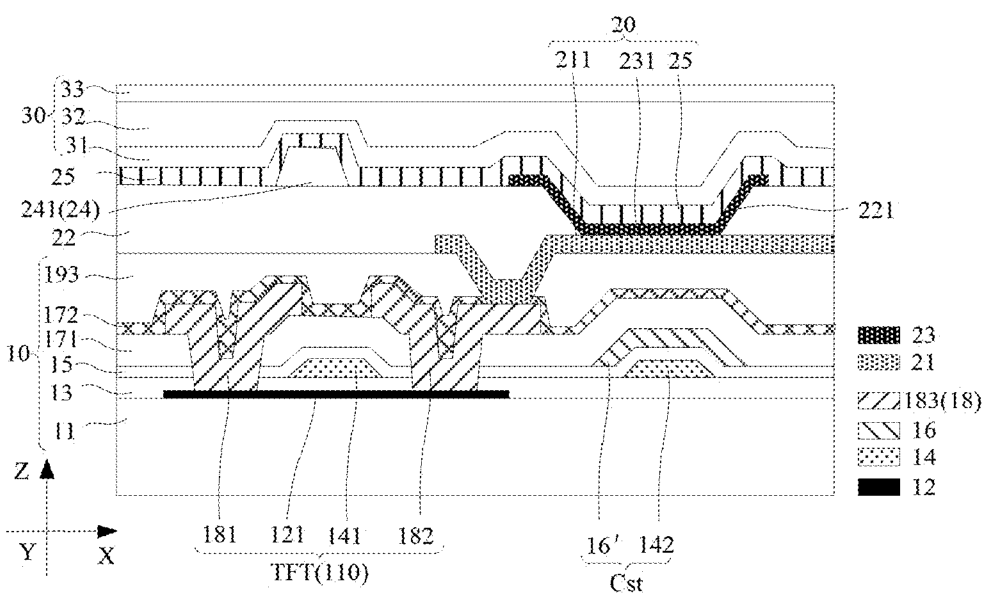

Referring to FIGS. 2A and 2B, the display panel 100 includes an array substrate 10, light-emitting devices 20 and an encapsulation layer 30 that are stacked. The array substrate 10 includes the substrate 11.

Referring to FIG. 2A, the array substrate 10 further includes a semiconductor layer 12, a first gate dielectric layer 13, a first gate layer 14, a second gate dielectric layer 15, a second gate layer 16, an interlayer dielectric layer 171, a first source-drain metal layer 181, a passivation layer 172, a first planarization layer 191, a second source-drain metal layer 182 and a second planarization layer 192 that are sequentially stacked on the substrate 11.

Alternatively, referring to FIG. 2B, the array substrate 10 further includes the semiconductor layer 12, the first gate dielectric layer 13, the first gate layer 14, the second gate dielectric layer 15, the second gate layer 16, the interlayer dielectric layer 171, a third source-drain metal layer 183, the passivation layer 172 and a third planarization layer 193 that are sequentially stacked on the substrate 11.

In an embodiment of the present disclosure, a first metal layer 18 includes a source-drain metal layer farthest away from the substrate 11, that is, the second source-drain metal layer 182 in FIG. 2A, or the third source-drain metal layer 183 in FIG. 2B.

In another embodiment of the present disclosure, the first metal layer 18 includes at least one metal layer in a plurality of metal layers on the substrate 11. For example, the first metal layer 18 includes one or more of the first gate layer 14, the second gate layer 16, the first source-drain metal layer 181 and the second source-drain metal layer 182 in FIG. 2A.

In an embodiment of the present disclosure, a planarization layer 19 includes a planarization layer farthest away from the substrate 11 (the planarization layer on a side of the first metal layer 18 away from the substrate 11), that is, the second planarization layer 192 in FIG. 2A, or the third planarization layer 193 in FIG. 2B.

In another embodiment of the present disclosure, the planarization layer 19 includes at least one planarization layer on the substrate 11, that is, the first planarization layer 191 and/or the second planarization layer 192 in FIG. 2A, or the third planarization layer 193 in FIG. 2B.

In the embodiments of the present disclosure, contents of the present disclosure are exemplarily described by taking the display panel 100 shown in FIG. 2A as an example.

The pixel driving circuit 110 includes a plurality of thin film transistors (TFTs) and at least one capacitor Cst (only one TFT and one capacitor Cst are exemplarily shown in the figures). For example, the pixel driving circuit 110 may be a "7T1C" circuit, a "7T2C" circuit, or a "3T1C" circuit. The structure of the pixel driving circuit 110 is not specifically limited in the embodiments of the present disclosure. Here, "T" represents a thin film transistor, the number before "T" represents the number of the thin film transistors, "C" represents a capacitor Cst, and the number before "C" represents the number of the capacitor(s) Cst.

Figure 4:
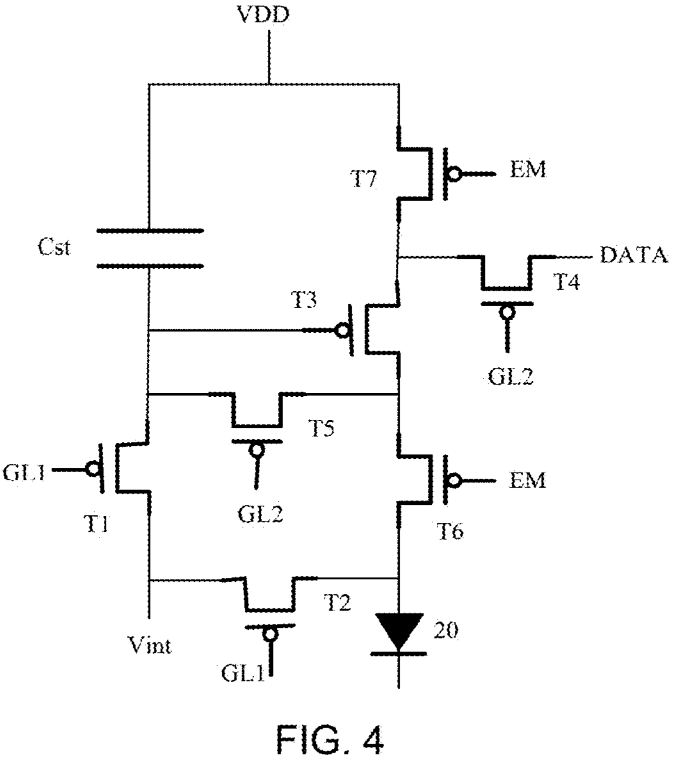
FIG. 4 is an equivalent circuit diagram of a pixel driving circuit, in accordance with some embodiments.

For example, referring to FIG. 4, the pixel driving circuit 110 may be the "7T1C" circuit. Thus, the pixel driving circuit 110 includes a first initialization transistor T1, a second initialization transistor T2, a driving transistor T3, a data writing transistor T4, a compensation transistor T5, a first light emission control transistor T6, a second light emission control transistor T7 and a capacitor Cst.

The first initialization transistor T1 is configured to provide an initialization signal to a control electrode of the driving transistor T3 under the control of a first scan line GL1. The second initialization transistor T2 is configured to provide the initialization signal to an anode of the light-emitting device 20 (an upper end of the light-emitting device 20 in FIG. 4) under the control of the first scan line GL1. The data writing transistor T4 and the compensation transistor T5 are configured to provide a data signal to the control electrode of the driving transistor T3 under the control of a second scan line GL2. The driving transistor T3 is configured to control a current passing through the light-emitting device 20 under the control of a data signal line DATA, so as to adjust light emission brightness of the light-emitting device. The first light emission control transistor T6 and the second light emission control transistor T7 are configured to control whether the light-emitting device 20 emits light under the control of an enable signal line EM.

The TFT may include a semiconductor pattern 121 located in the semiconductor layer 12, a gate 141 located in the first gate layer 14, and a source 18' and a drain 18" located in the first source-drain metal layer 181. The capacitor Cst may include a first electrode plate 142 located in the first gate layer 14 and a second electrode plate 161 located in the second gate layer 16.

Figure 3A:
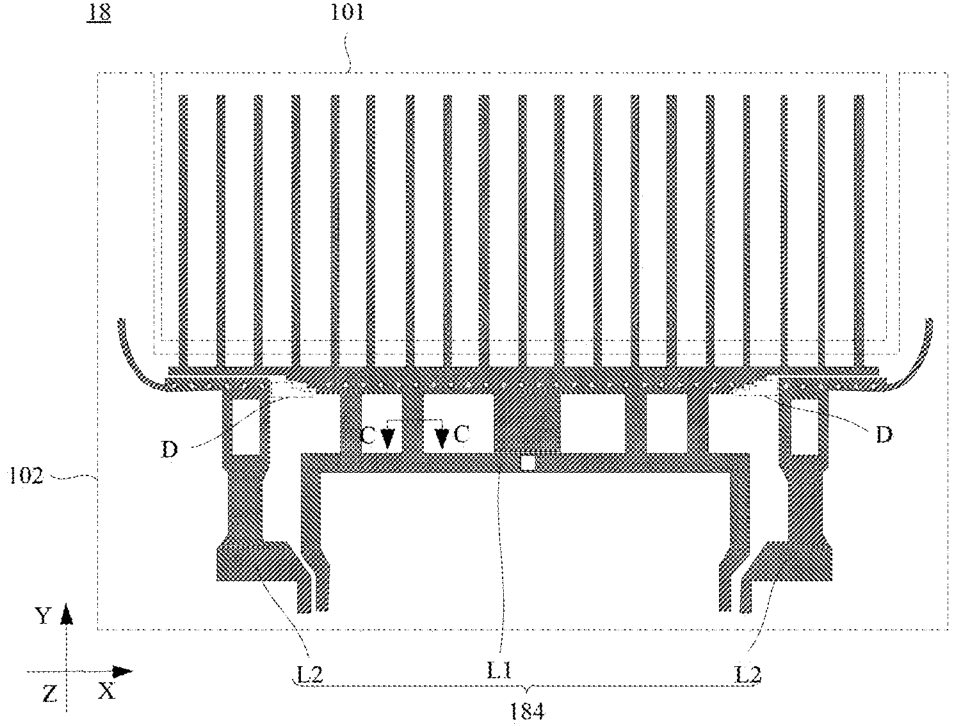
FIG. 3A is a structural diagram of a first metal layer, in accordance with some embodiments.
Figure 6:
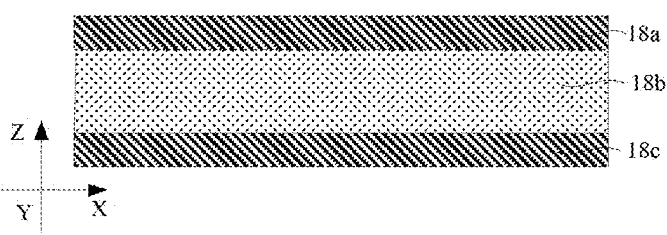
FIG. 6 is a schematic diagram of a structure taken along a section line C-C in FIG. 3A or FIG. 3B.

Referring to FIG. 3A, FIG. 3A is a partial structural diagram of the first metal layer 18. The first metal layer 18 includes a signal line pattern 184 located in the peripheral region 120. Referring to FIG. 6, FIG. 6 is a cross-sectional view of a structure of the first metal layer 18. The first metal layer 18 includes a metal titanium layer 18*a*, a metal aluminum layer 18*b* and a metal titanium layer 18*c* stacked in sequence, that is, the first metal layer 18 has a laminate structure of titanium-aluminum-titanium. The metal aluminum layer 18*b* is beneficial to improving the conductivity of the first metal layer 18 and reducing the resistance of the first metal layer 18. The metal titanium layer 18*a* and the metal titanium layer 18*c* can protect the metal aluminum layer 18*b* and reduce the risk of the metal aluminum layer 18*b* being oxidized or corroded. The thicknesses of the metal titanium layer 18*a* and the metal titanium layer 18*c* may be equal or different.

Figure 8:
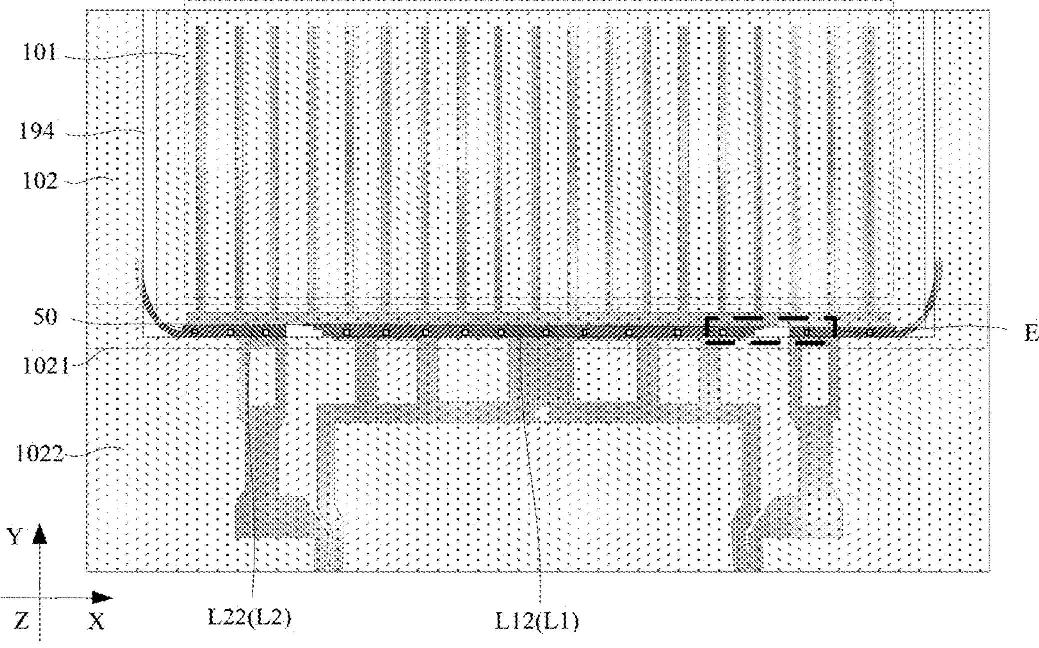
FIG. 8 is a structural diagram of an array substrate, in accordance with some embodiments.

Referring to FIGS. 2A and 8, the planarization layer 19 (e.g., the second planarization layer 192) is located on a side of the first metal layer 18 (e.g., the second source-drain metal layer 182) away from the substrate 11, and the planarization layer 19 is provided therein with opening(s) 194 in the peripheral region 102. The planarization layer 19 includes an organic material, and the organic material has certain water absorption characteristics. The opening(s) 194 may prevent moisture outside from entering the display region 101 of the display panel 100 along the planarization layer 19.

For example, the planarization layer 19 is provided therein with an opening 194 in the peripheral region 102, and the opening 194 may be in an annular shape and arranged around the display region 101. In this way, the opening 194 may cut off the path of the moisture entering the display region 101 of the display panel 100 along the organic layer (the planarization layer 19) to the maximum extent.

For example, the planarization layer 19 is provided therein with openings 194 in the peripheral region 102, and the openings 194 may be discontinuous, that is, the openings 194 are discontinuous around the display region 101. For example, the planarization layer 19 includes a plurality of openings 194, the plurality of openings 194 are disposed around the display region 101, and there is an interval between any two adjacent openings 194.

For example, the opening(s) 194 may have an arc structure or a right angle structure at a corner of the peripheral region 102.

For example, the opening(s) 194 may have the same or different widths (a width being a dimension in a direction parallel to a plane where the display panel 100 is located and perpendicular to an extending direction of the opening(s) 194) at various positions.

The embodiments of the present disclosure do not specifically limit the structure (position, shape, size, etc.) of the opening(s) 194.

Referring to FIG. 2A, the light-emitting device 20 includes an anode layer 21, a pixel defining layer 22, a light-emitting layer 23, a spacer layer 24 and a cathode layer 25 that are disposed on the planarization layer 19 sequentially in a direction perpendicular to the substrate 11 and away from the substrate 11.

The anode layer 21 includes a plurality of anodes 211 separated from each other (only one anode 211 is exemplarily shown in FIG. 2A). The pixel defining layer 22 has a plurality of first openings 221, and each first opening 221 exposes at least a portion of an anode 211.

The light-emitting layer 23 includes a plurality of light-emitting patterns 231, and at least a portion of each light-emitting pattern 231 is located in a first opening 221. The light-emitting layer 23 may include one or more of an electron transport layer (ETL), an electron injection layer (EIL), a hole transport layer (HTL) and a hole injection layer (HIL).

The spacer layer 24 includes a plurality of spacers 241, and the spacer 241 is used for supporting a mask in an evaporation process. The cathode layer 25 may have a whole layer structure. A material of the cathode layer 25 may be a transparent conductive material, such as indium tin oxide (ITO). A light-emitting device 20 includes an anode 211, a light-emitting pattern 231 on the anode 211, and a portion of the cathode layer 25 in contact with the light-emitting pattern 231.

The encapsulation layer 30 is disposed on a side of the cathode layer 25 away from the substrate 11. The encapsulation layer 30 is configured to isolate corrosion of the light-emitting device 20 by moisture and oxygen. For example, the encapsulation layer 30 may include a first inorganic layer 31, an organic encapsulation layer 32 and a second inorganic layer 33 that are sequentially stacked. The first inorganic layer 31 and the second inorganic layer 33 are configured to block moisture and oxygen from the outside, and the organic encapsulation layer 32 is configured to perform stress release in the film layers and planarization.

In some embodiments, the display panel 100 may further include a touch function layer 40 disposed on the encapsulation layer 30, that is, the display panel 100 adopts a flexible multiple layer on cell (FMLOC) process.

Figure 5A:
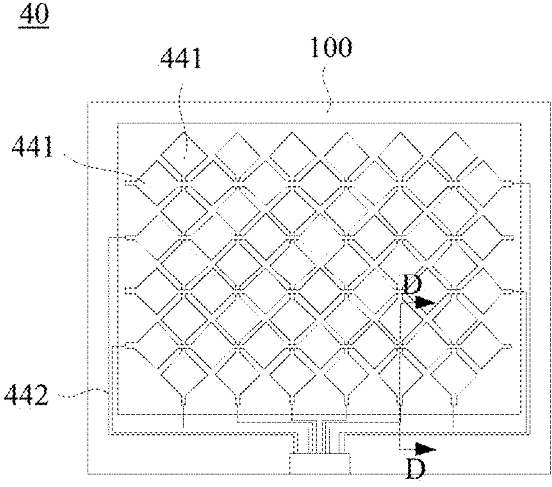
FIG. 5A is a plan view of a structure of a touch function layer, in accordance with some embodiments.
Figure 5B:
FIG. 5B is a cross-sectional view taken along a section line D-D in FIG. 5A.

Referring to FIGS. 5A and 5B, FIG. 5A is a plan view of a structure of the touch function layer 40, and FIG. 5B shows a cross-sectional structure of the touch function layer 40. The touch function layer 40 may include an isolation layer 41, a first electrode layer 42, an insulating layer 43, a second electrode layer 44 and an insulating covering layer 45 that are arranged in sequence in a direction (a third direction Z) perpendicular to the display panel 100 and away from the display panel 100.

A material of the isolation layer 41 may be silicon nitride (SiNx). The insulating layer 43 is used to separate the first electrode layer 42 and the second electrode layer 44, so as to avoid electrical contact between the two at a position other than an expected position. For example, a material used for the insulating layer 43 may also be silicon nitride (SiNx). The insulating covering layer 45 is used to protect the second electrode layer 44. For example, a material of the insulating covering layer 45 may include polyimide (PI) resin.

The first electrode layer 42 includes a plurality of bridge lines 421, which are generally formed by stacking metal titanium, metal aluminum and metal titanium in sequence, or stacking indium tin oxide (ITO), silver and indium tin oxide in sequence. That is, the bridge line 421 adopts a titanium-aluminum-titanium stack structure, or an ITO-silver-ITO stack structure.

The second electrode layer 44 includes a plurality of touch electrodes 441 and a plurality of touch lines 442. Two touch electrodes 441 adjacent in a first direction X (a horizontal direction in FIG. 3A) are directly electrically connected, and two touch electrodes 441 adjacent in a second direction Y (a vertical direction in FIG. 3A) are electrically connected by a bridge line 421 located in the first electrode layer 42. In addition, the material of the second electrode layer 44 may be the same as the material of the first electrode layer 42.

It can be understood that the positions of the first electrode layer 42 and the second electrode layer 44 may be exchanged, that is, the first electrode layer 42 may include a plurality of touch electrodes 441 and a plurality of touch lines 442, and the second electrode layer 44 includes a plurality of bridge lines.

Figure 7:
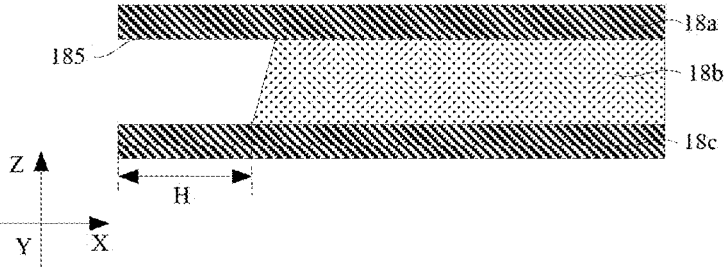
FIG. 7 is a structural diagram of an undercut formed in a sidewall of a signal line pattern in the related art.

In the related art, the process of forming the planarization layer 19 (the annular opening 194) includes a development process. During development, part of the developing solution will be in contact with a sidewall of the first metal layer 18 located in the opening 194, and undergo a chemical reaction ($2Al+2OH^-+2H_2O=2AlO_2^-+3H_2\uparrow$) with the metal aluminum layer 18*b* in the first metal layer 18, and thus an undercut 185 (as shown in FIG. 7) is formed in the sidewall of the first metal layer 18. Moreover, in the subsequent process of forming the anode layer 21, the etchant solution will further etch the metal aluminum layer in the first metal layer 18, thereby deepening a depth H of the undercut 185. In this way, in the subsequent process of forming the encapsulation layer 30 (the first inorganic layer 31 and the second inorganic layer 33) by chemical vapor deposition (CVD), part of the material of the encapsulation layer 30 is embedded in the undercut 185, so as to cause microcracks in the encapsulation layer 30 near the undercut 185, thereby affecting the encapsulation effect of the display panel 100, increasing the risk of the moisture entering the display region 101, and easily causing the failure of the luminescent material to generate dark spots (the dark spots are called "GDSX defects"). As shown in FIG. 3A, in the peripheral region 102, an area D between a first voltage signal line L1 and a second voltage signal line L2 along the first direction X is a GDSX area.

Figure 9A:
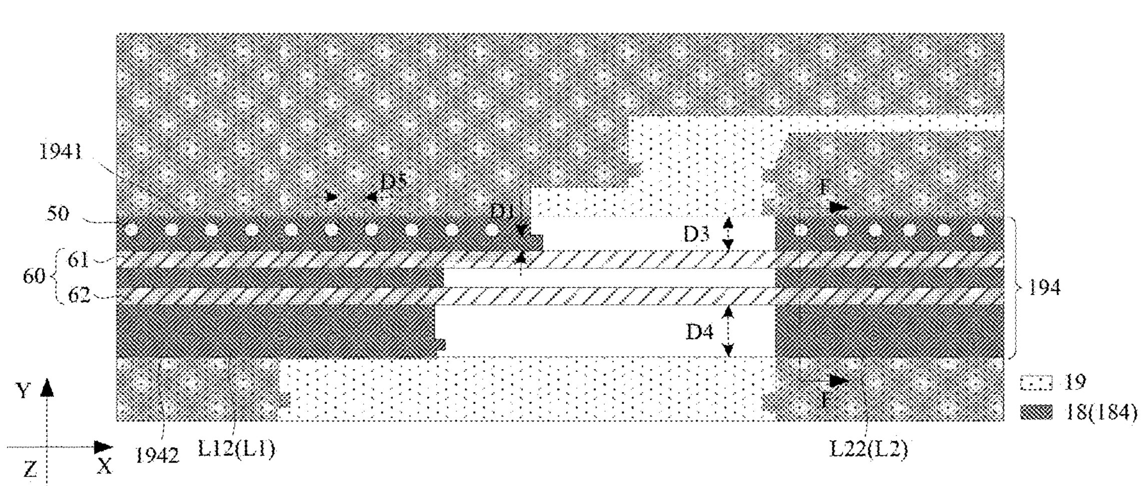
FIG. 9A is a partial enlarged view of a region E in FIG. 8.
Figure 9B:
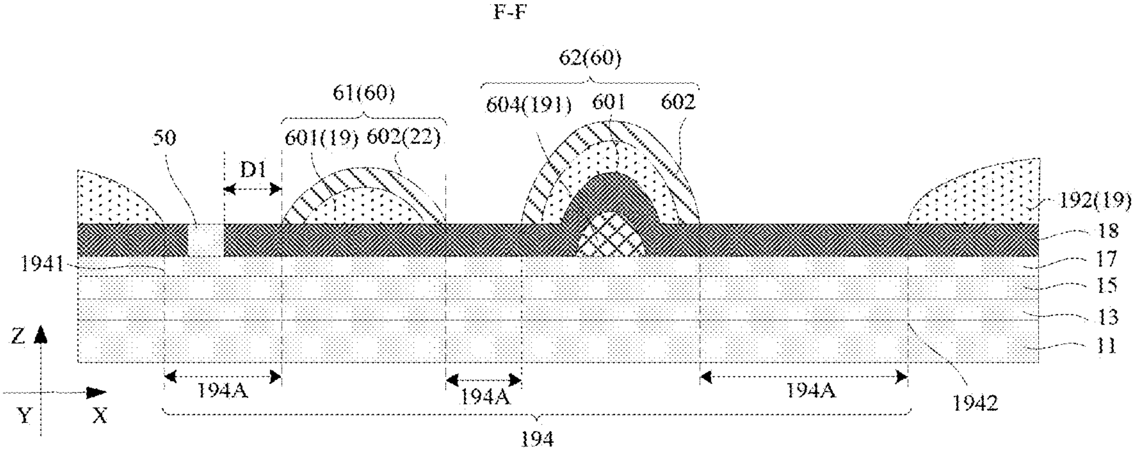
FIG. 9B is a cross-sectional view taken along a section line F-F in FIG. 9A.

In order to solve the above problems, some embodiments of the present disclosure provide a display panel 100. Referring to FIGS. 8, 9A and 9B, the display panel 100 further includes a retaining wall structure 60. The retaining wall structure 60 is located in the peripheral region 102, and at least a portion of the retaining wall structure 60 is located in the opening 194. An orthogonal projection of the portion of the retaining wall structure 60 in the opening 194 on the substrate 11 partially overlaps an orthogonal projection of the signal line pattern 184 on the substrate 11, that is, at least a portion of the signal line pattern 184 is located below the portion of the retaining wall structure 60 in the opening 194.

At least one through hole 50 is provided in the signal line pattern 184. An orthogonal projection of the at least one through hole 50 on the substrate 11 is located within an orthogonal projection of the opening 194 on the substrate 11, and is located on a side of an orthogonal projection of the retaining wall structure 60 on the substrate 11 proximate to the display region 101 and/or away from the display region 101.

Figure 10A:
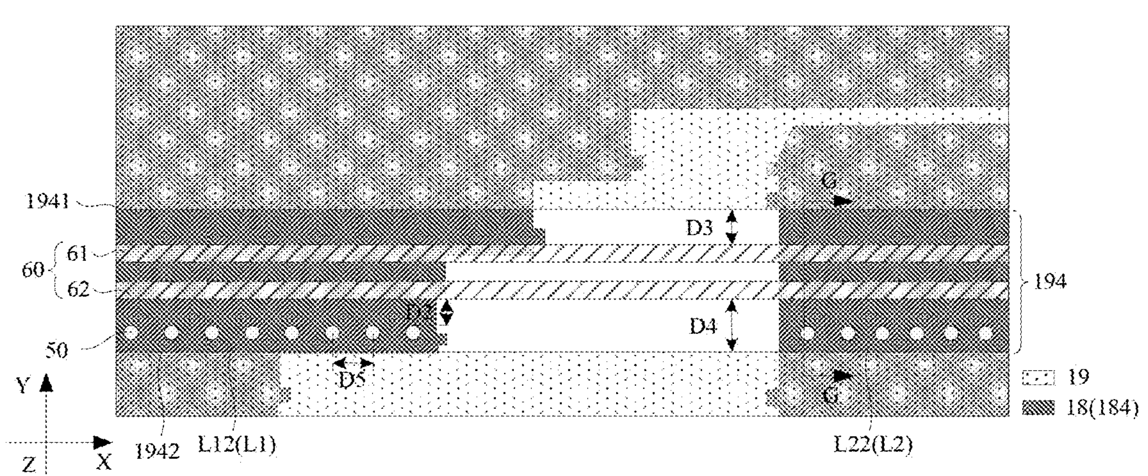
FIG. 10A is another partial enlarged view of a region E in FIG. 8.
Figure 10B:
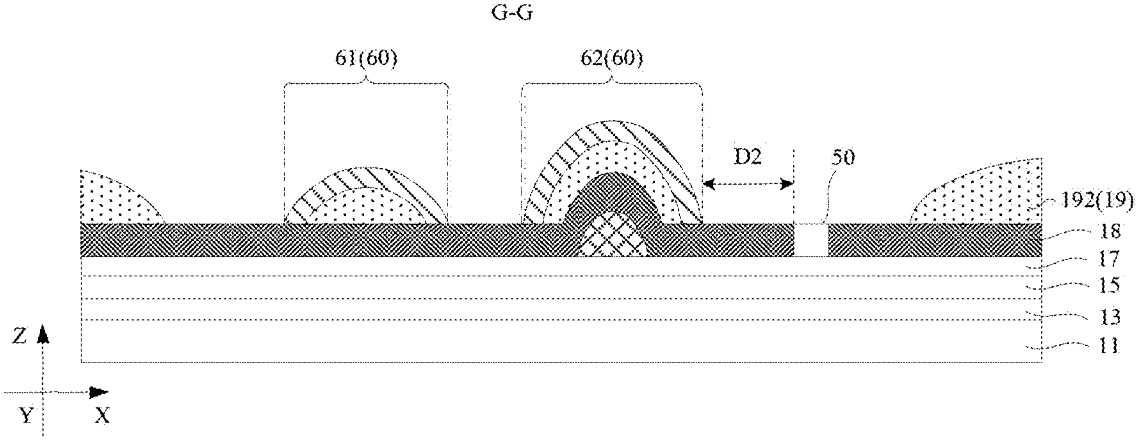
FIG. 10B is a cross-sectional view taken along a section line G-G in FIG. 10A.
Figure 11A:
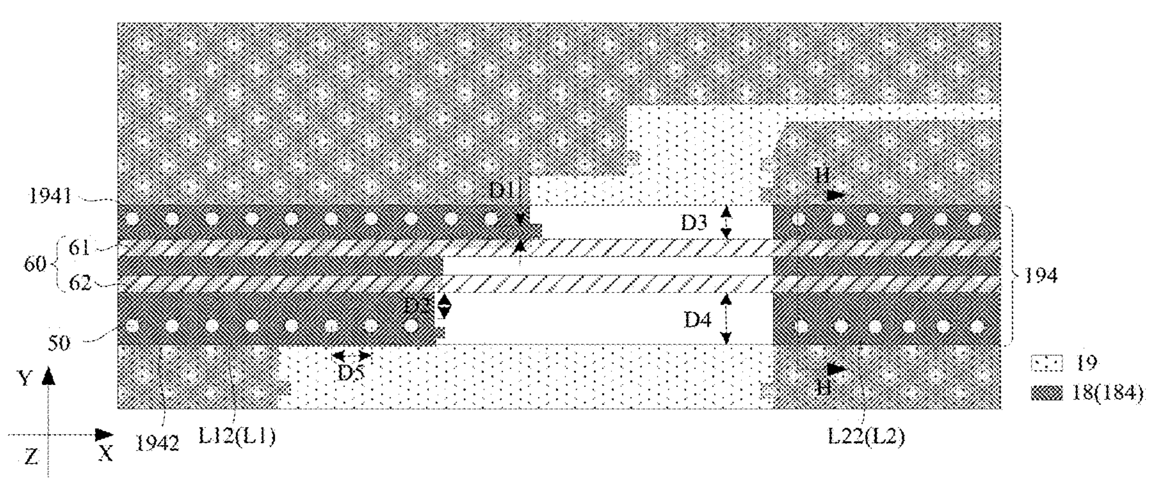
FIG. 11A is yet another partial enlarged view of a region E in FIG. 8.
Figure 11B:
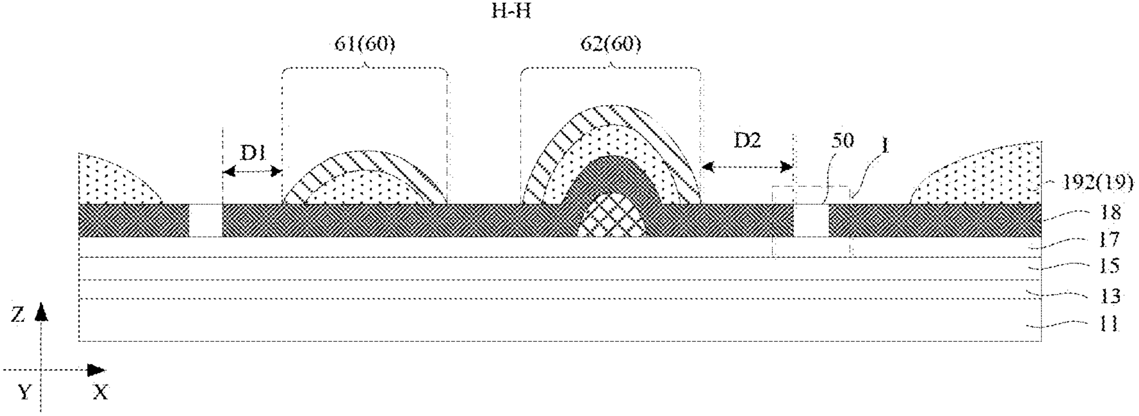
FIG. 11B is a cross-sectional view taken along a section line H-H in FIG. 11A.

That is, a portion of the signal line pattern 184 located in the opening 194 is provided with through hole(s) 50. The through hole(s) 50 are located on a side of the retaining wall structure 60 proximate to the display region 101 (as shown in FIGS. 9A and 9B). Alternatively, the through hole(s) 50 are located on a side of the retaining wall structure 60 away from the display region 101 (as shown in FIGS. 10A and 10B). Alternatively, the through hole(s) 50 include part of through holes located on a side of the retaining wall structure 60 proximate to the display region 101, and part of through holes located on a side of the retaining wall structure 60 away from the display region 101 (as shown in FIGS. 11A and 11B).

Figure 13:
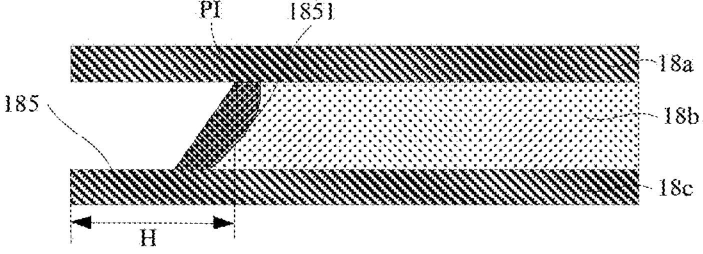
FIG. 13 is a structural view of an undercut in a sidewall at a through hole, in accordance with some embodiments.

In the display panel 100 provided by some embodiments of the present disclosure, the first metal layer 18 includes the through hole(s) 50 located in the peripheral region 102, and the orthogonal projection of the through hole(s) 50 on the substrate 11 is located within the orthogonal projection of the opening 194 in the planarization layer 19 on the substrate 11. In this way, the through hole(s) 50 may increase an area of the sidewall of the first metal layer 18. In the subsequent process of forming the planarization layer 19 (forming the opening 194), the amount of the developing solution per unit area in contact with the first metal layer 18 (sidewall) may be reduced, so as to share the developing solution and reduce a loading effect of the developing solution, thereby reducing an erosion effect of the developing solution on the first metal layer 18, reducing the risk of forming the undercut 185 (undercut) in the sidewall of the first metal layer 18, and reducing the depth of the formed undercut 185 (as shown in FIG. 13). This is beneficial for reducing the risk of the encapsulation layer 30 being embedded in the above undercut 185, and reducing the amount of the material of the encapsulation layer 30 embedded in the undercut 185, thereby reducing the risk of the encapsulation layer 30 generating the microcracks at the undercut 185, reducing the risk of the moisture entering the display region 101 along the microcracks, and further improving the encapsulation performance of the display panel 100.

See FIG. 12 and Table 1 below.

TABLE 1

Depths of undercuts when through holes are provided at different positions

| After HPDL development (Å) | | | A1 | | | | A2 | | | | |
|---|---|---|---|---|---|---|---|---|---|---|---|
| | | | Inside Dam 1 | Between Dam 1 and Dam 2 | Outside Dam 2 | square pattern | Inside Dam 1 | Between Dam 1 and Dam 2 | Outside Dam 2 | square pattern | AVE |
| Split1: 0 μm | Offset: 0 | SD undercut | 8513 | 8273 | 8841 | — | 8882 | 8841 | 12280 | — | 9272 |
| | | PI residue | 3279 | 3528 | 3321 | — | 3362 | 3570 | 4403 | — | 3577 |
| Split2: 16 μm outside Dam 2 | Offset: −40 | SD undercut | 5686 | 5298 | 5611 | 5504 | 5603 | 5405 | 6152 | 5504 | 5595 |
| | | PI residue | — | — | 1577 | — | — | — | 2283 | — | 1930 |
| Split3: 36 μm outside Dam 2 | Offset: −60 | SD undercut | 3777 | 4192 | 4109 | 3669 | 5303 | 4192 | 4690 | 4748 | 4335 |
| | | PI residue | — | — | — | — | — | — | — | — | — |
| Split4: 56 μm outside Dam 2 | Offset: −80 | SD undercut | 4101 | 4358 | 4031 | 3885 | 4192 | 5695 | — | 1619 | 3589 |
| | | PI residue | — | — | — | — | — | — | — | — | — |
| Split5: 16 μm inside Dam 1 | Offset: +120 | SD undercut | 4815 | 4348 | 4358 | 4532 | 4192 | 5695 | — | 4748 | 4670 |
| | | PI residue | 1204 | — | — | — | — | — | — | — | 1204 |
| Split6: 36 μm inside Dam 1 | Offset: +140 | SD undercut | 4151 | 4109 | 4358 | 4317 | 4192 | 4220 | 4358 | 1660 | 3921 |
| | | PI residue | — | — | — | — | — | — | — | — | — |

In Table 1, A1 and A2 refer to two comparative tests carried out at the same position. The “-” means the number 0. The unit of each value is “Å” (i.e., $10^{-10}$ meter). “Inside” refers to a side proximate to the display region 101, and “outside” refers to a side away from the display region 101.

Figure 12:
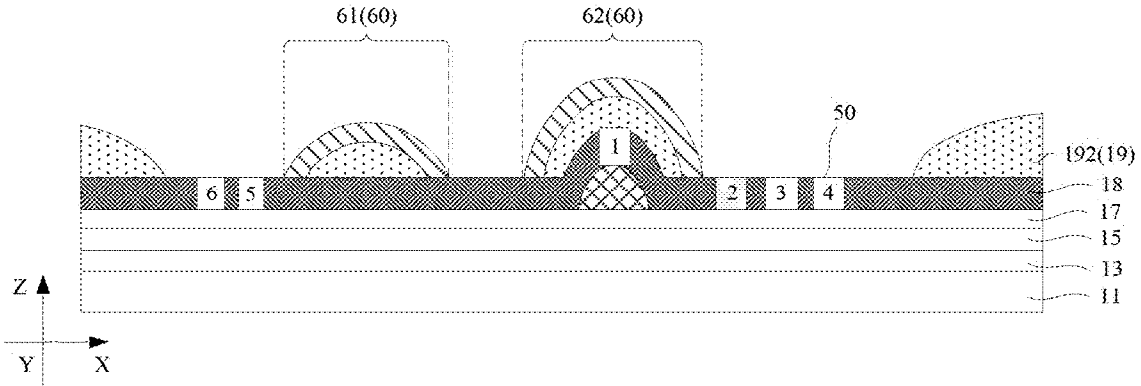
FIG. 12 is a schematic diagram of positions of through holes, in accordance with some embodiments.

Numbers 1 to 6 in FIG. 12 respectively correspond to positions of through holes 50 in “Split1 to Split6” in Table 1. Taking Split1 as an example, Split1 refers to providing the through hole 50 within the retaining wall structure 60 (a center position of the second retaining wall 62), that is, the position 1 in FIG. 12, and the depth of the undercut 185 at each position corresponding to the through hole 50 of the signal line pattern 184 is provided.

It will be understood that, at Split1 in Table 1, the through hole 50 is covered by the planarization layer 19 under the retaining wall structure 60, and during forming the opening 194 by etching, the developing solution will not be in contact with the sidewall of the through hole 50. Therefore, it can be used as a blank control group, that is, the depths of the undercuts 185 (SD Undercut) at different positions of the first metal layer 18 in a case of no through hole 50 provided. It can be seen that in a case where the through hole 50 is not provided or the through hole 50 is provided under the retaining wall structure 60 (an orthogonal projection of the retaining wall structure 60 on the substrate 11 overlaps an orthogonal projection of the through hole 50 on the substrate 11), the average depth of the undercuts 185 at different positions of the first metal layer 18 is 9272 Å, that is, 0.927 μm.

It can be seen from Split2 to Split4 that in a case where the through hole 50 is provided on the side of the retaining wall structure 60 away from the display region 101, the average depths of the undercuts 185 at different positions of the first metal layer 18 are respectively 0.560 μm, 0.434 μm and 0.359 μm, all less than 0.927 μm. That is, in the case where the through hole 50 is provided on the side of the retaining wall structure 60 away from the display region 101, the average depth of the undercuts 185 at different positions of the signal line pattern 184 may be significantly reduced.

It can be seen from Split5 and Split6 that in a case where the through hole 50 is provided on the side of the retaining wall structure 60 proximate to the display region 101, the average depths of the undercuts 185 at different positions of the first metal layer 18 are respectively 0.467 μm and 0.392 μm, both less than 0.927 μm. That is, in the case where the through hole 50 is provided on the side of the retaining wall structure 60 proximate to the display region 101, the average depth of the undercuts 185 at different positions of the first metal layer 18 may be significantly reduced.

It can be seen from the above that providing the through hole(s) 50 in the signal line pattern 184 (the orthogonal projection of the through hole 50 on the substrate 11 is located within the orthogonal projection of the opening 194 on the substrate 11, and is located on a side of the orthogonal projection of the retaining wall structure 60 on the substrate 11 proximate to and/or on a side of the orthogonal projection of the retaining wall structure 60 on the substrate 11 away from the display region 101) may reduce the average depth of the undercuts 185 at different positions of the signal line pattern 184, thereby reducing the amount of the material of the encapsulation layer 30 embedded in the undercut 185, reducing the risk of the encapsulation layer 30 generating the microcracks at the undercut 185, reducing the risk of the moisture entering the display region 101 along the microcracks, and further improving the encapsulation performance of the display panel 100.

It will be understood that, referring to Table 1 and FIG. 13, during forming the pixel defining layer 22 (PDL layer), there will be some PI residual in the above undercut 185. Filling PI in the undercut 185 may reduce the depth of the undercut 185. That is, the final depth of the formed undercut 185 is a depth of the etched metal aluminum layer (SD Undercut) minus a depth of the PI residual in the undercut 185.

In some embodiments, referring to FIGS. 9A and 10A, the retaining wall structure 60 includes a first retaining wall 61 (Dam 1) and a second retaining wall 62 (Dam 2) arranged at intervals. The first retaining wall 61 is closer to the display region 101 than the second retaining wall 62. The at least one through hole 50 is provided on a side of the first retaining wall 61 proximate to the display region 101 (as shown in FIG. 9A), or on a side of the second retaining wall 62 away from the display region 101 (as shown in FIG. 10A). The retaining wall structure 60 may improve the encapsulation performance of the display panel 100 and reduce the risk of the moisture entering the display region 101.

The through hole 50 provided on the side of the retaining wall structure 60 proximate to the display region 101 means that the at least one through hole 50 is provided on a side of the first retaining wall 61 proximate to the display region 101. The through hole 50 provided on the side of the retaining wall structure 60 away from the display region 101 means that the at least one through hole 50 is provided on a side of the second retaining wall 62 away from the display region 101. That is to say, the at least one through hole 50 is provided on the side of the first retaining wall 61 proximate to the display region 101, and/or on the side of the second retaining wall 62 away from the display region 101.

Figure 14:
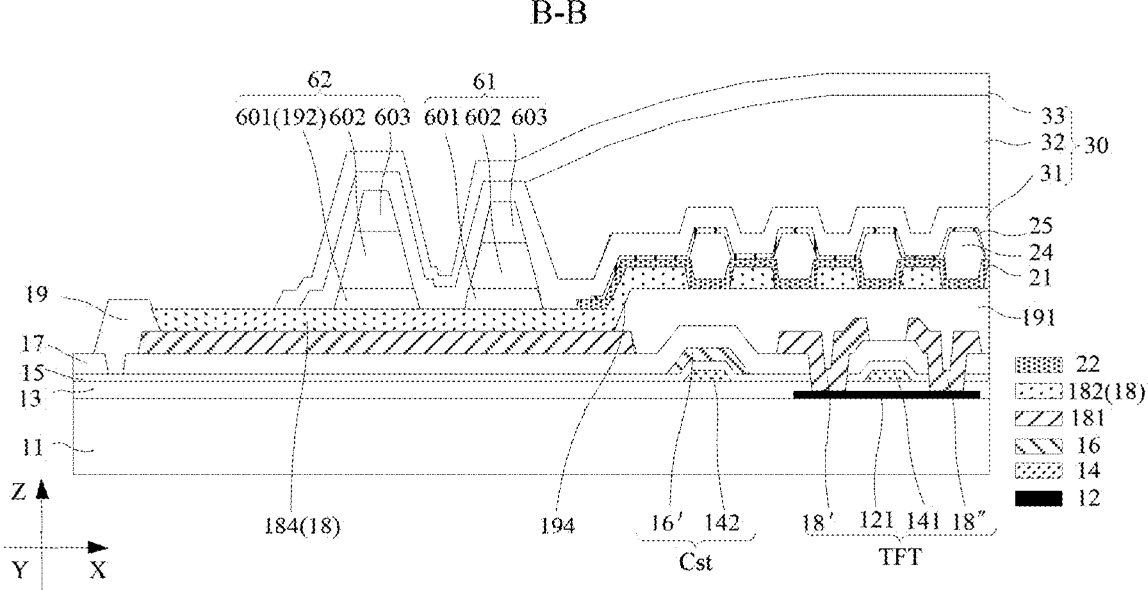
FIG. 14 is a schematic diagram of a structure taken along a section line B-B in FIG. 1.

In some embodiments, referring to FIG. 14, the retaining wall structure 60 (the first retaining wall 61 and/or the second retaining wall 62) includes one or more of a first spacer block 601, a second spacer block 602 and a third spacer block 603 that are stacked. The first spacer block 601 is made of the same material and disposed in the same layer as the planarization layer 19 (the second planarization layer 192), the second spacer block 602 is made of the same material and disposed in the same layer as the pixel defining layer 22, and the third spacer block 603 may be made of the same material and disposed in the same layer as the spacer layer 24. In a case where the display panel 100 includes the first planarization layer 191, the retaining wall structure 60 may further include a fourth spacer block 604, and the fourth spacer block 604 is made of the same material and disposed in the same layer as the first planarization layer 191. For example, referring to FIG. 14, the first retaining wall 61 and the second retaining wall 62 each include a first spacer block 601, a second spacer block 602 and a third spacer block 603, and the second retaining wall 42 further includes a fourth spacer block 604.

It can be understood that, in a case where the retaining wall structure 60 includes the first spacer block 601 that is made of the same material and disposed in the same layer as the planarization layer 19 (the second planarization layer 192), the first spacer block 601 divides the opening 194 to form a plurality of sub-openings 194A. For example, referring to FIG. 9B, in a case where both the first retaining wall 61 and the second retaining wall 62 include first spacer blocks 601, the first spacer blocks 601 divide the opening 194 to form three sub-openings 194A. The three sub-openings 194A are a sub-opening 194A between a first edge 1941 and the first retaining wall 61, a sub-opening 194A between the first retaining wall 61 and the second retaining wall 62, and a sub-opening 194A between the second retaining wall 62 and a second edge 1942. In this way, the description of "the orthogonal projection of the through hole 50 on the substrate 11 is located within the orthogonal projection of the opening 194 on the substrate 11" means that the orthogonal projection of the through hole 50 on the substrate 11 is located within the orthogonal projection of the sub-opening 194A on the substrate 11, that is, the through hole 50 is disposed in a portion of the first metal layer 18 corresponding to the opening 194 and not covered by the retaining wall structure 60.

In some embodiments, the first metal layer 18 includes at least one voltage signal line, a portion of the at least one voltage signal line is disposed in the peripheral region 102 and located in the at least one opening 194. The through hole 50 is disposed in the portion of the at least one voltage signal line located in the peripheral region 102 and in the at least one opening 194 (hereinafter referred to as a first portion). In this way, the erosion of the sidewall of the first portion of the signal line by the etching solution and the developing solution may be reduced, and the depth of the undercut 185 formed in the sidewall of the signal line may be reduced.

For example, the at least one voltage signal line includes a first voltage signal line (e.g., a VDD voltage signal line) and a second voltage signal line (e.g., a VSS voltage signal line). For example, the first voltage signal line L1 is configured to provide a VDD voltage signal to the pixel driving circuit, and the second voltage signal line L2 is configured to provide a VSS voltage signal to the light-emitting device.

Figure 3B:
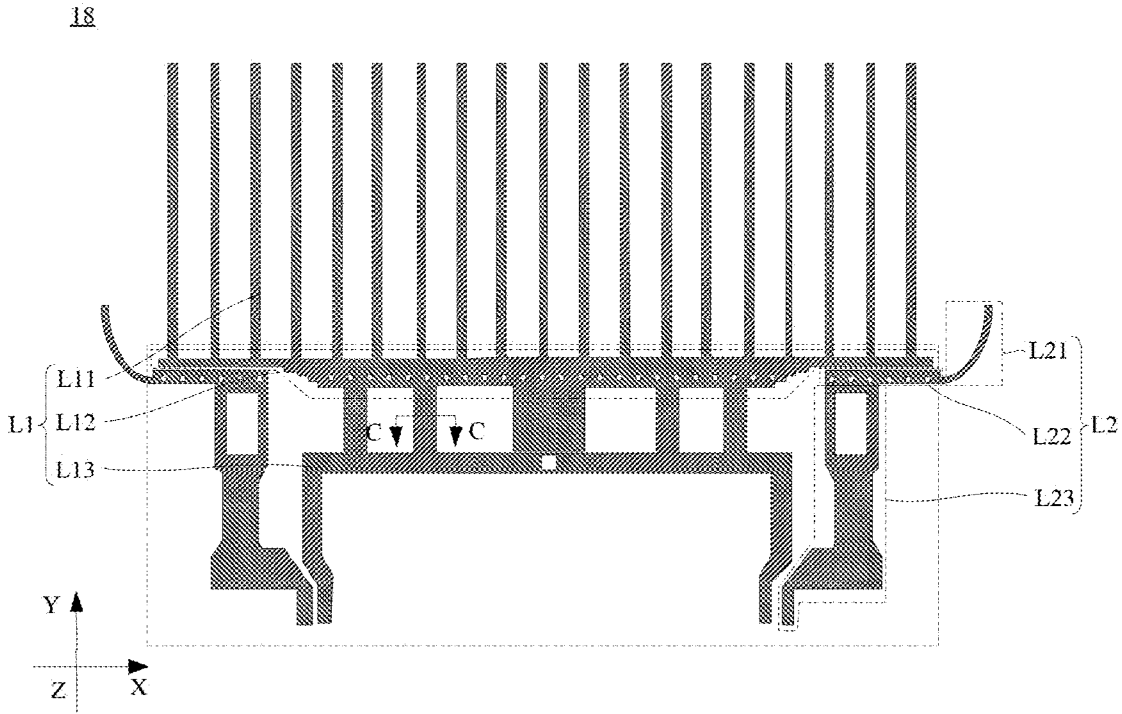
FIG. 3B is a structural diagram of a first metal layer, in accordance with some embodiments.

Referring to FIG. 3B, FIG. 3B shows part of the structure of the first voltage signal line and the second voltage signal line located in the first metal layer 18. At least part of the first voltage signal line L1 and the second voltage signal line L2 are located in the first metal layer 18.

For example, referring to FIGS. 3A and 3B, the first voltage signal line L1 may include a plurality of first sub-lines L11, a first bus L12 and a first connection line L13 that are located in the first metal layer 18. The plurality of first sub-lines L11 are located in the display region 101 and arranged side by side in the first direction X, and each first sub-line L11 extends in the second direction Y. The first bus L12 is located in the fan-out area 1021 and extends in the first direction X. An end of each first sub-line L11 proximate to the fan-out area 1021 is electrically connected to the first bus L12. The first connection line L13 is electrically connected to the first bus L12 and extends from the fan-out area 1021 to the bonding area 1022.

The first direction X is an extending direction of an edge line between the display region 101 and the fan-out area 1021, that is, the horizontal direction in FIG. 3B. The second direction Y is perpendicular to the first direction X, that is, the vertical direction in FIG. 3B.

For example, referring to FIGS. 3A and 3B, the second voltage signal line L2 may include a second sub-line L21, second buses L22 and second connection lines L23 that are located in the first metal layer 18. The second sub-line L21 is located in an area of the peripheral region 102 except the bonding area 1022 and at least partially surrounds the display region 101. Both ends of the second sub-line L21 extend to the fan-out area 1021. The second bus L22 is located in the fan-out area 1021 and is electrically connected to an end of the second sub-line L21 extending to the fan-out area 1021. The second connection line L23 is electrically connected to the second bus L22 and extends from the fan-out area 1021 to the bonding area 1022.

The first bus L12 and the second buses L22 extend in the first direction X.

The second voltage signal line L2 includes two second buses L22. In the first direction X, the two second buses L22 are located on both sides of the fan-out area 1021. Each second bus L22 is electrically connected to an end of the second sub-line L21 extending to the same side of the fan-out area 1021 as the second bus L22.

For example, referring to FIG. 3B, a width of two ends of the first bus L12 is smaller than a width of a middle thereof. In this way, stepped shapes are formed at the ends of the first bus L12. The second bus L22 is disposed besides the step, and in the first direction X, an end of the second bus L22 proximate the step is opposite to the first bus L12. The area D between the second bus L22 and the first bus L12 is called the GDSX area.

Referring to FIGS. 8 and 9A, the orthogonal projection of the opening 194 on the substrate 11 partially overlaps orthogonal projections of the first bus L12 and the second bus L22 on the substrate 11. The signal line pattern 184 may include portions of the first voltage signal line L1 and the second voltage signal line L2 located in the fan-out area 1021. For example, the signal line pattern 184 includes the first bus L12 and the second buses L22.

In some embodiments, referring to FIGS. 9A, 10A and 11A, the signal line pattern 184 is provided with a plurality of through holes 50 therein. The plurality of through holes 50 are arranged in at least one row, and multiple through holes 50 in a row are arranged at intervals in an extension direction (i.e., the first direction X) of the retaining wall structure 60 located in the opening 194. The plurality of through holes 50 may further increase the area of the sidewall of the signal line pattern 184 (the portion not covered by the planarization layer 19), increase an effect of the through holes 50 sharing the load effect of the developing solution, and reduce the risk and the depth of the undercut 185 generated in the signal line pattern 184. The arrangement of the plurality of through holes 50 in the first direction X is beneficial to simplifying a pattern of the signal line pattern 184 and reducing the processing difficulty of the plurality of through holes 50.

Figure 15A:
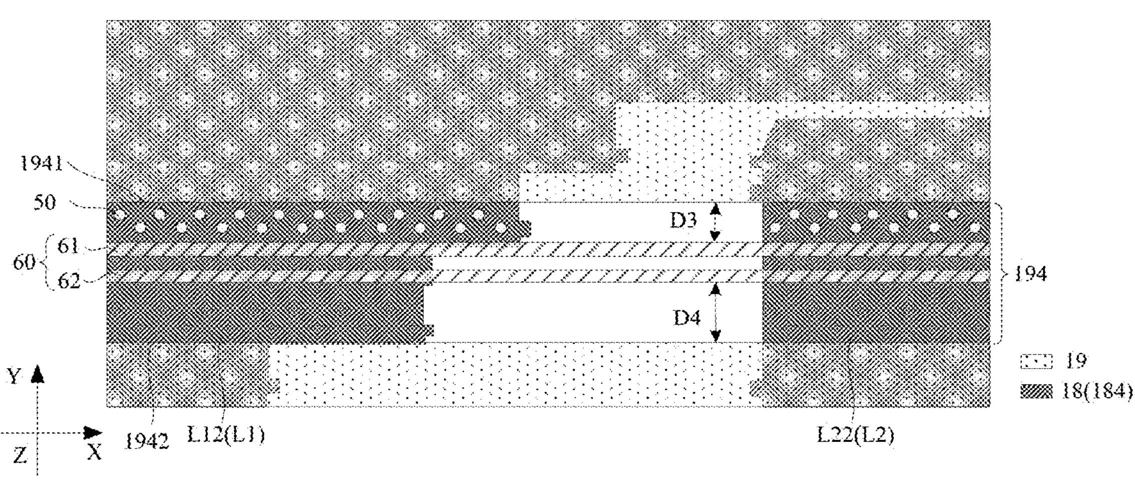
FIG. 15A is yet another partial enlarged view of a region E in FIG. 8.

In some embodiments, at least one row of through holes are provided on a side of the retaining wall structure 60 proximate to the display region 101. For example, one row of through holes 50 (as shown in FIG. 9A) may be provided. Alternatively, two rows of through holes 50 (as shown in FIG. 15A) may be provided.

Figure 15B:
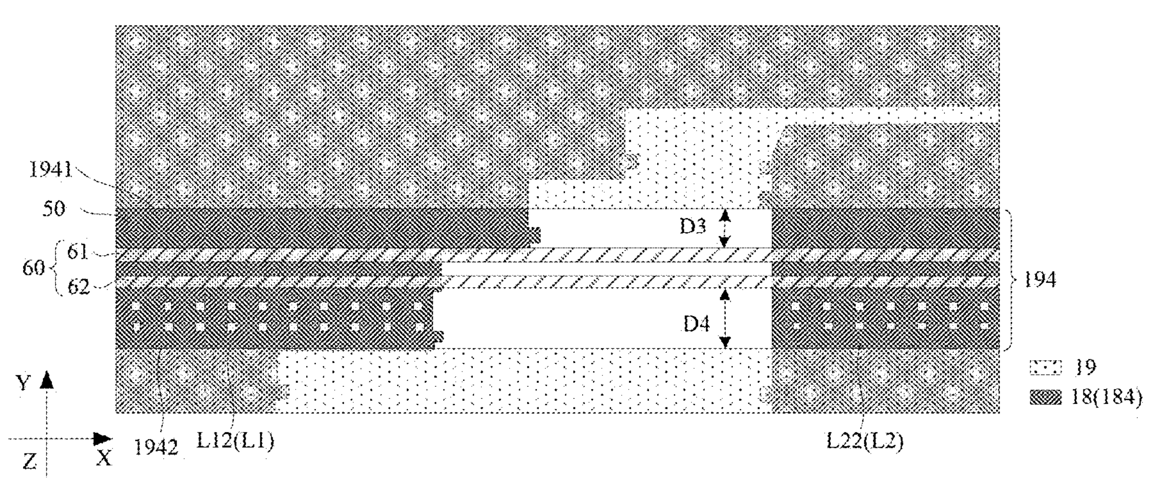
FIG. 15B is yet another partial enlarged view of a region E in FIG. 8.

In some embodiments, at least one row of through holes 50 are provided on a side of the retaining wall structure 60 away from the display region 101. For example, one row of through holes 50 (as shown in FIG. 10A) may be provided. Alternatively, two rows of through holes 50 (as shown in FIG. 15B) may be provided.

Figure 15C:
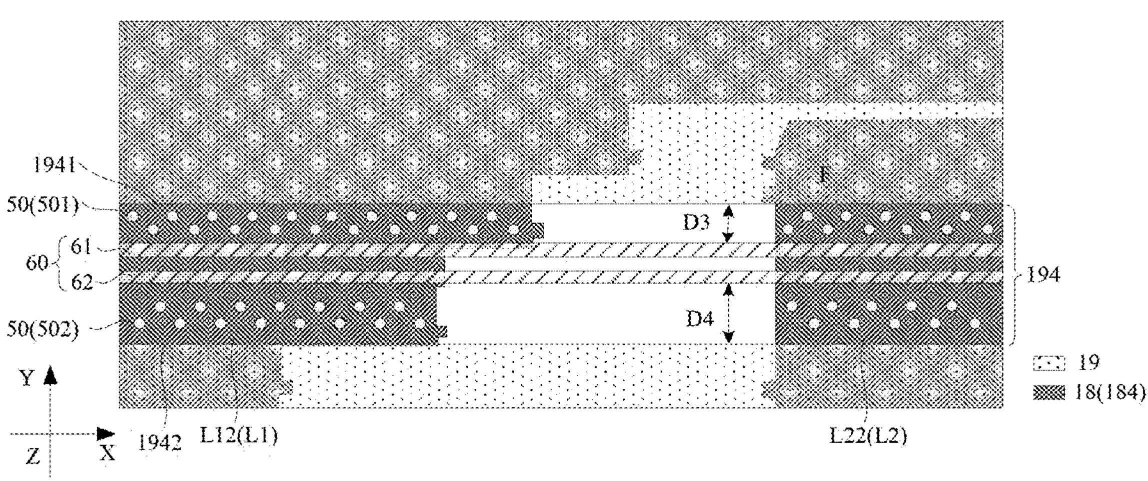
FIG. 15C is yet another partial enlarged view of a region E in FIG. 8.

In some embodiments, at least one row of through holes are provided on a side of the retaining wall structure 60 proximate to the display region 101, and at least one row of through holes 50 are provided on a side of the retaining wall structure 60 away from the display region 101. The number of rows of through holes 50 on each of both sides of the retaining wall structure 60 and the number of through holes 50 in each row may be equal or different. For example, one row of through holes 50 may be provided on the side of the retaining wall structure 60 proximate to the display region 101, and two rows of through holes 50 may be provided on the side of the retaining wall structure 60 away from the display region 101 (as shown in FIG. 15C). Alternatively, one row of through holes 50 may be provided on each of both sides of the retaining wall structure 60 (as shown in FIG. 11A).

In some embodiments, referring to FIG. 15C, the plurality of through holes 50 are arranged in a plurality of rows. In a direction (the second direction Y) perpendicular to an arrangement direction (the first direction X) of a row of through holes 50, any two adjacent rows of through holes 50 are spaced apart. The arrangement of the plurality of rows of through holes 50 may increase the number of the through holes 50, thereby increasing the effect of the through holes 50 sharing the loading effect of the developing solution, and reducing the risk and the depth of the undercut 185 generated in the signal line pattern 184. The plurality of rows of through holes 50 may be located on the same side of the retaining wall structure 60, or located on different sides of the retaining wall structure 60.

For example, the plurality of rows of through holes 50 are located on the same side of the retaining wall structure 60. For example, the plurality of rows of through holes 50 are all located on the side of the retaining wall structure 60 away from the display region 101 (as shown in FIG. 15B), or located on the side of the retaining wall structure 60 proximate to the display region 101 (as shown in FIG. 15A).

For example, the plurality of rows of through holes 50 are located on different sides of the retaining wall structure 60. For example, the plurality of rows of through holes 50 include two rows of through holes 50, and the two rows of through holes 50 are located on both sides of the retaining wall structure 60 (as shown in FIG. 11A). Alternatively, at least one side (a side proximate to the display region 101 or a side away from the display region 101) of the retaining wall structure 60 includes at least one row of through holes 50 (as shown in FIG. 15C).

Figure 11C:
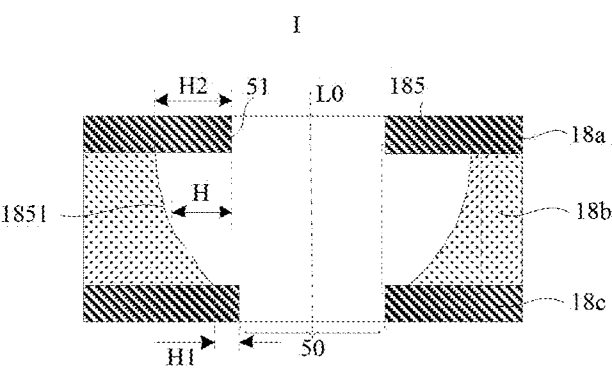
FIG. 11C is a partial enlarged view of a region I in FIG. 11B.

In some embodiments, referring to FIG. 11C, FIG. 11C is a cross-sectional view of a through hole 50. The sidewall 51 of the at least one through hole 50 includes an undercut 185, and a bottom wall 1851 of the undercut 185 is substantially arc-shaped. Moreover, an end of the bottom wall 1851 proximate to the substrate 11 (a lower end in FIG. 11C) is closer to a center line L0 of the through hole 50 than an end farther away from the substrate 11 (an upper end in FIG. 11C).

A maximum distance (i.e., a maximum depth H2 of the undercut 185) between a lowest point of the bottom wall 1851 (usually at the end of the bottom wall 1851 farther away from the substrate 11) and the sidewall 51 of the through hole 50 (the sidewall of the metal titanium layer 18*a*) is inversely related to the number of the through holes 50. That is, the more the number of the through holes 50, the better the effect of the through holes 50 on sharing the developing solution and the etching solution, the smaller the erosion of the sidewall of the through hole 50 by the developing solution and the etching solution, and thus, the smaller the maximum distance between the lowest point of the bottom wall 1851 and the sidewall 51 of the through hole 50. Conversely, the less the number of through holes 50, the greater the maximum distance between the lowest point of the bottom wall 1851 and the sidewall 51 of the through hole 50.

In some embodiments, the sidewall 51 of the at least one through hole 50 includes an undercut 185. The more the number of the through holes 50, the smaller the average depth of each through hole 50, or the smaller the average depth recessed by the undercut 185. That is, the more the number of the through holes 50, the better the effect of the through holes 50 on sharing the developing solution and the etching solution, the smaller the erosion of the sidewall of the through hole 50 by the developing solution and the etching solution, and the smaller the average depth of the through hole 50 or the smaller the average depth recessed by the undercut 185.

For example, as shown in FIG. 15C, the opening 194 includes a first edge 1941 and a second edge 1942 opposite to each other. The first edge 1941 is located on the side of the retaining wall structure 60 proximate to the display region 101, and the second edge 1942 is located on the side of the retaining wall structure 60 away from the display region 101. The first through holes 501 are provided between the retaining wall structure 60 and the first edge 1941, and second through holes 502 are provided between the retaining wall structure 60 and the second edge 1942.

For example, the number of the first through holes 501 is less than the number of the second through holes 502, and the average depth (the depth H) of the undercut 185 in the sidewall 51 of the first through hole 501 is smaller than the average depth of the undercut 185 in the sidewall 51 of the second through hole 52.

It can be understood that the number of the first through holes 501 being less than the number of the second through holes 502 refers to that the number of the first through holes 501 per unit area is less than the number of the second through holes 502 per unit area. Therefore, it can also be understood that the distribution density of the first through holes 501 is smaller than the distribution density of the second through holes 502.

The bottom wall 1851 of the undercut 185 may not be flat or smooth. Therefore, the average depth H of the undercut 185 may be understood as an average value of the maximum depth H2 and a minimum depth H1 of the undercut 185. For example, referring to FIG. 11C, the average depth H of the undercut 185 may be the average value of the maximum depth H2 and the minimum depth H1 of the undercut 185.

For example, the number of the second through holes 502 is less than the number of the first through holes 501, and the average depth of the undercut 185 in the sidewall 51 of the second through hole 502 is smaller than the average depth of the undercut 185 in the sidewall 51 of the first through hole 501.

For example, the number of the first through holes 501 is equal to the number of the second through holes 502, and the average depth of the undercut 185 in the sidewall 51 of the first through hole 501 is approximately equal to the average depth of the undercut 185 in the sidewall 51 of the second through hole 502.

In some embodiments, referring to FIG. 9A, the opening 194 includes a first edge 1941 and a second edge 1942 opposite to each other. The first edge 1941 is located on the side of the retaining wall structure 60 proximate to the display region 101, and the second edge 1942 is located on the side of the retaining wall structure 60 away from the display region 101.

A distance between the retaining wall structure 60 (the first retaining wall 61) and the first edge 1941 is a third distance D3, and a distance between the retaining wall structure 60 (the second retaining wall 62) and the second edge 1942 is a fourth distance D4. The third distance D3 is smaller than the fourth distance D4, which is beneficial to improving the encapsulation performance of the display panel 100.

For example, the third distance D3 between the retaining wall structure 60 and the first edge 1941 may be in a range of 50 μm to 60 μm, for example, the third distance D3 is 50 μm, 55 μm or 60 μm. The fourth distance D4 between the retaining wall structure 60 and the second edge 1942 may be in a range of 85 μm to 110 μm, for example, the fourth distance D4 is 85 μm, 95 μm or 110 μm.

At least one through hole 50 is provided between the retaining wall structure 60 and the first edge 1941, and a minimum distance between the at least one through hole 50 and the retaining wall structure 60 is a first distance D1. At least one through hole 50 is provided between the retaining wall structure 60 and the second edge 1942, and a minimum distance between the at least one through hole 50 and the retaining wall structure 60 is a second distance D2. Adapting to the fact that the third distance D3 is smaller than the fourth distance D4, the first distance D1 is smaller than the second distance D2, which is beneficial to optimizing the spatial arrangement of the plurality of through holes 50.

In some embodiments, at least one through hole 50 is provided between the retaining wall structure 60 (the first retaining wall 61) and the first edge 1941, and the minimum distance D1 between the at least one through hole 50 and the retaining wall structure 60 is in a range of 11 μm to 40 μm. In this case, the through hole 50 has a rather good effect on sharing the load effect of the developing solution. For example, the minimum distance D1 between the through hole 50 that is provided between the retaining wall structure 60 and the first edge 1941 and the retaining wall structure 60 is 11 μm, 16 μm, 21 μm, 36 μm or 40 μm, which are not listed here.

In an example, it has been verified through multiple tests that in a case where the minimum distance D1 between the through hole 50 that is provided between the retaining wall structure 60 (the first retaining wall 61) and the first edge 1941 and the retaining wall structure 60 is 16 μm, the effect of reducing the depth of the undercut 185 is good, and the depth of the final undercut 185 is about 0.35 μm.

For example, referring to Split5 in the above Table 1, in a case where the first distance D1 is 16 μm, the average depth of the final undercut 185 is about 0.347 μm, which is a difference between 0.467 μm and 0.120 μm (i.e., 0.467 μm−0.120 μm=0.347 μm). Referring to Split6, in a case where the first distance D1 between the through hole 50 and the retaining wall structure 60 is 36 μm, the average depth of the final undercut 185 is about 0.392 μm, which is a difference between 0.392 μm and 0.000 μm (i.e., 0.392 μm−0.000 μm=0.392 μm).

In some embodiments, at least one through hole 50 is provided between the retaining wall structure 60 (the second retaining wall 62) and the second edge 1942, the minimum distance between the at least one through hole 50 and the retaining wall structure 60 is the second distance D2, and the second distance D2 is in a range of 11 μm to 75 μm. In this case, the through hole 50 has a rather good effect on sharing the load effect of the developing solution. For example, the second distance D2 between the through hole 50 provided between the retaining wall structure 60 and the second edge 1942 and the retaining wall structure 60 is 11 μm, 16 μm, 36 μm, 51 μm, 56 μm or 61 μm, which are not listed here.

In an example, it has been verified through multiple tests that in a case where the second distance D2 between the through hole 50 that is provided between the retaining wall structure 60 and the second edge 1942 and the retaining wall structure 60 is 56 μm, the effect of reducing the depth of the undercut 185 is good, and the depth of the final undercut 185 is about 0.35 μm.

For example, referring to Split3 in the above Table 1, in a case where the second distance D2 between the through hole 50 and the retaining wall structure 60 is 36 μm, the average depth of the final undercut 185 is about 0.434 μm, which is a difference between 0.434 μm and 0.000 μm (i.e., 0.434 μm−0.000 μm=0.434 μm). Referring to Split4 in the above Table 1, in a case where the second distance D2 between the through hole 50 and the retaining wall structure 60 is 56 μm, the depth of the final undercut 185 is about 0.359 μm, which is a difference between 0.359 μm and 0.000 μm (i.e., 0.359 μm−0.000 μm=0.359 μm).

In some embodiments, at least one through hole 50 is provided between the retaining wall structure 60 and the first edge 1941, and the minimum distance between the through hole 50 and the first edge 1941 is approximately equal to the distance (i.e., the first distance D1) between the through hole 50 and the retaining wall structure 60. And/or, at least one through hole 50 is provided between the retaining wall structure 60 and the second edge 1942, and the distance between the through hole 50 and the second edge 1942 is approximately equal to the distance (i.e., the second distance) between the through hole 50 and the retaining wall structure 60. That is, the distance between the through hole 50 and the retaining wall structure 60 is approximately equal to the distance between the through hole 50 and the edge of the opening 194. In the second direction Y, the through hole 50 is approximately located in a middle area between the retaining wall structure 60 and the edge of the opening 194.

For example, the third distance D3 between the retaining wall structure 60 and the first edge 1941 may be 52 μm, at least one through hole 50 is provided between the retaining wall structure 60 and the first edge 1941, the first distance D1 between the through hole 50 and the retaining wall structure 60 is 16 μm, a size of the through hole 50 in the second direction Y may be 20 μm, and the distance between the through hole 50 and the first edge 1941 is 16 μm.

For example, the fourth distance D4 between the retaining wall structure 60 and the second edge 1942 may be 110 μm, at least one through hole 50 is provided between the retaining wall structure 60 and the second edge 1942, the second distance D2 between the through hole 50 and the retaining wall structure 60 is 56 μm, a size of the through hole 50 in the second direction Y may be 15 μm, and the distance between the through hole 50 and the second edge 1942 is 39 μm.

In some embodiments, referring to FIGS. 15A and 15C, the shape of the orthogonal projection of the through hole 50 on the substrate 11 may be circular or rectangular (rectangle or square), which is beneficial to simplifying the pattern of the through hole 50 and reducing the difficulty in forming the through hole 50. In a case where the signal line pattern 184 is provided with a plurality of through holes 50, the shapes of the orthogonal projections of the plurality of through holes 50 on the substrate 11 may be the same or different, which is not specifically limited in the embodiments of the present disclosure.

For example, the shape of the orthogonal projection of the through hole 50 on the substrate 11 is a circle, and a diameter of the circle may be in a range of 3 μm to 25 μm.

For example, the shape of the orthogonal projection of the through hole 50 on the substrate 11 is a rectangle, and a maximum side length of the through hole 50 may be in a range of 3 μm to 25 μm.

In some embodiments, an area of a sidewall of each through hole 50 is in a range of 40 $\mu m^2$ to 100 $\mu m^2$. In a case where the area of the sidewall of the through hole 50 is too small (e.g., less than 40 $\mu m^2$), the through hole 50 is small, which may not be conducive to the patterning of the through hole 50 and not be conducive to improving the effect of the through hole 50 sharing the load effect of the developing solution. In a case where the area of the sidewall of the through hole 50 is too large (e.g., greater than 100 $\mu m^2$), the through hole 50 is large, which may affect the impedance of the signal line pattern 184 and reduce structural strength of the signal line pattern 184.

For example, in a direction perpendicular to the display panel 100, the thickness of the first metal layer 18 is generally in a range of 0.7 μm to 1.0 μm. For example, the thickness of the first metal layer 18 is 0.7 μm, 0.8 μm or 1.0 μm.

For example, in the case where the shape of the orthogonal projection of the through hole 50 on the substrate 11 is a circle, a diameter of the circle may be 20 μm or 25 μm. In the case where the shape of the orthogonal projection of the through hole 50 on the substrate 11 is a rectangle, a length (a dimension in the first direction X) of the rectangle may be 20 μm, and a width (a dimension in the second direction Y) thereof may be 15 μm. The shape and size of the through hole 50 may be selected according to actual needs, and are not listed here.

In a case where a plurality of through holes 50 are provided in the signal line pattern 184, a distance D5 between two adjacent through holes 50 may be in a range of 1 μm to 20 μm. For example, the distance between two adjacent through holes 50 in a row of through holes 50 may be 1 μm, 10 μm or 20 μm. Alternatively, the distance D5 between two adjacent rows of through holes 50 may be 1 μm, 10 μm or 20 μm.

In some embodiments, the orthogonal projection of the opening 194 on the substrate 11 partially overlaps the orthogonal projections of the first bus L12 and the second bus L22 on the substrate 11, that is, at least part of the first bus L12 and the second bus L22 is located within the opening 194. In this way, the through hole 50 may be provided in the first bus L12 and/or the second bus L22.

Figure 16A:
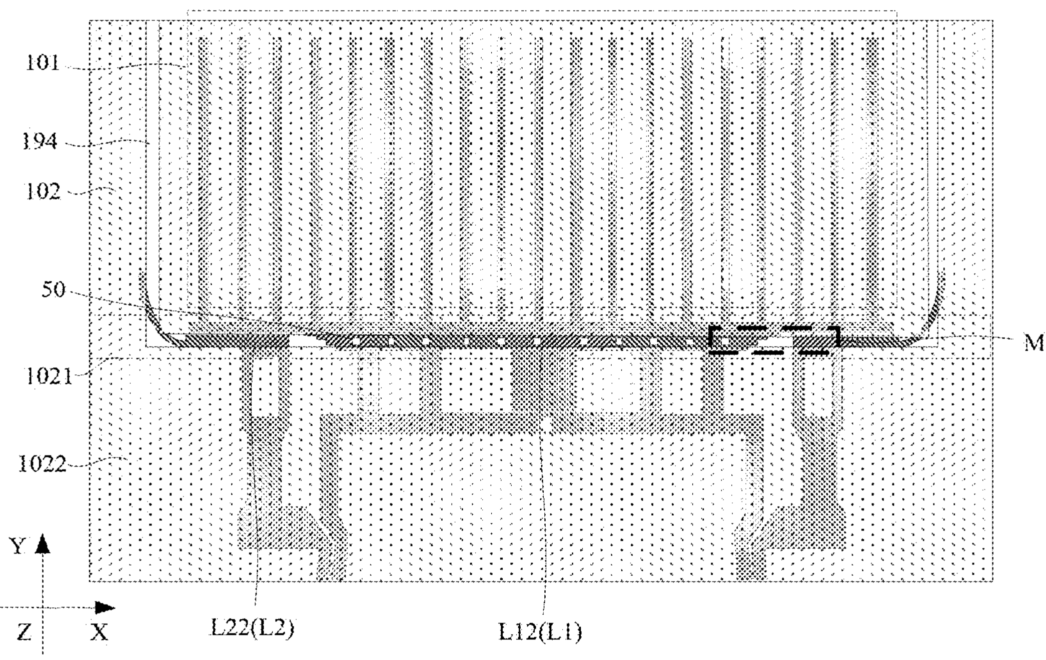
FIG. 16A is a structural diagram of another array substrate, in accordance with some embodiments.
Figure 16B:
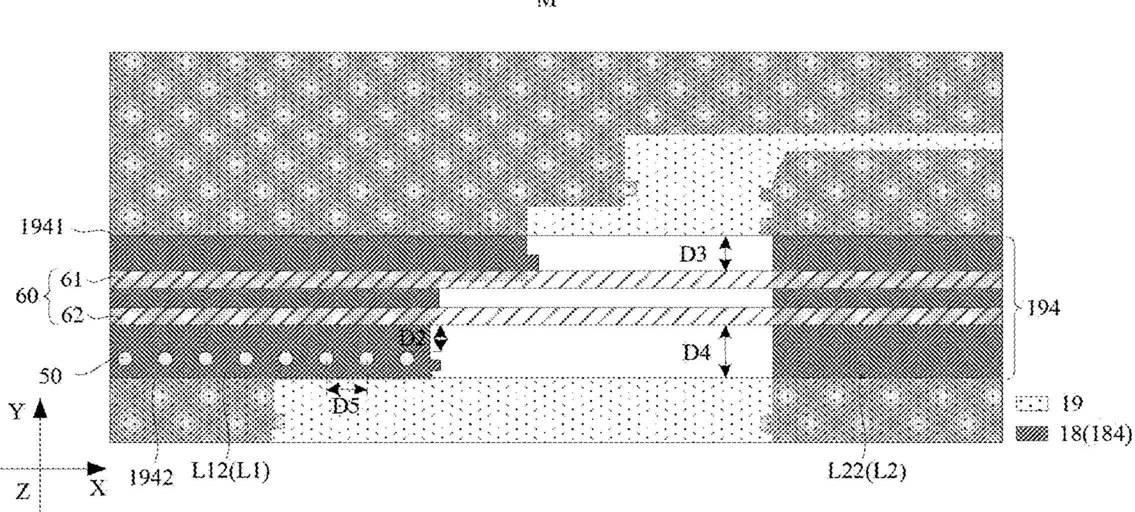
FIG. 16B is a partial enlarged view of a region M in FIG. 16A.
Figure 17A:
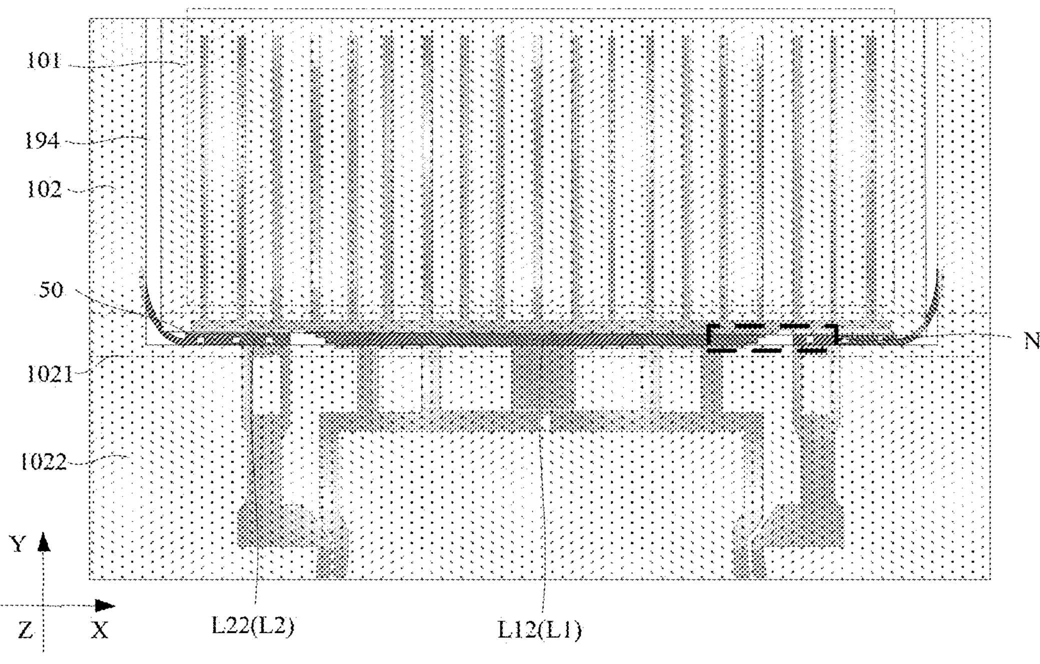
FIG. 17A is a structural diagram of yet another array substrate, in accordance with some embodiments.
Figure 17B:
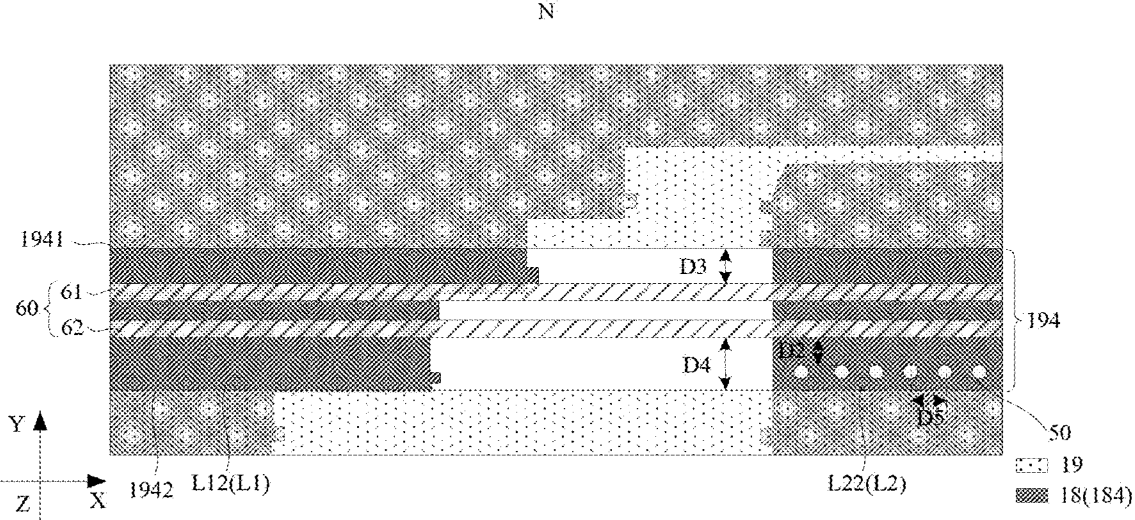
FIG. 17B is a partial enlarged view of a region N in FIG. 17A.

For example, at least one through hole 50 may be provided in the first bus L12 (as shown in FIGS. 16A and 16B). Alternatively, at least one through hole 50 may be provided in the second bus L22 (as shown in FIGS. 17A and 17B). Alternatively, at least one through hole 50 may be provided in the first bus L12, and at least one through hole 50 may be provided in the second bus L22 (as shown in FIGS. 8 and 9A).

In some embodiments, the display panel 100 is a flexible display panel, and at least a portion of the bonding area 1022 bends to a back side of the display region 101. During bending the bonding area 1022, both sides of the bonding area 1022 in the first direction X bears greater stress than the middle.

In this way, referring to FIGS. 16A and 16B, a plurality of through holes 50 may be provided in the first bus L12, and the plurality of through holes 50 are arranged in a row in the first direction X. That is, the through holes 50 are only provided in the first bus L12, which may reduce the risk of breakage or deformation of the second bus L22.

In some embodiments, the display panel 100 may be a rigid display panel, and in the first direction X, all positions of the bonding area 1022 are evenly stressed.

In this way, FIGS. 16A and 16B, a plurality of through holes 50 may be provided in at least one second bus L22, and the plurality of through holes 50 are arranged in a row in the first direction X. For example, two second buses L22 are each provided with a plurality of through holes 50 therein. In this way, the number of the through holes 50 may be increased, thereby increasing the effect of the through holes 50 sharing the load effect of the developing solution and reducing the risk and the depth of the undercut 185 generated in the signal line pattern 184.

Alternatively, referring to FIGS. 8 and 9A, a plurality of through holes 50 may be provided in the first bus L12, and the plurality of through holes 50 are arranged in a row in the first direction X. In addition, a plurality of through holes 50 are provided in at least one second bus L22, and the plurality of through holes 50 are arranged in a row in the first direction X.

Figure 18:
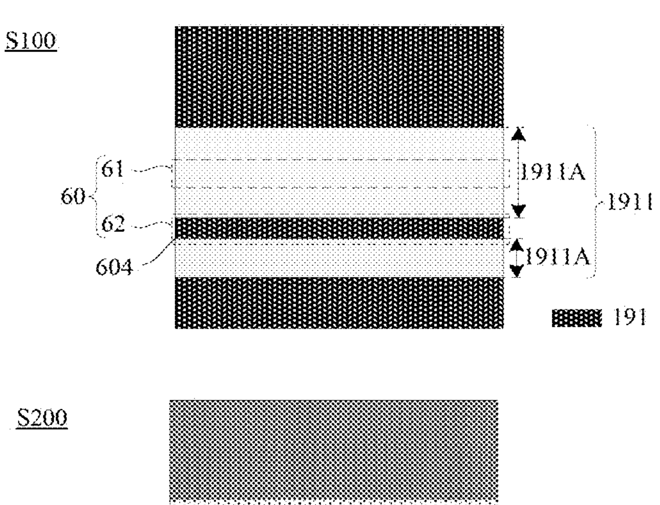
FIG. 18 is a diagram showing steps of manufacturing a display panel, in accordance with some embodiments.
Figure 18:
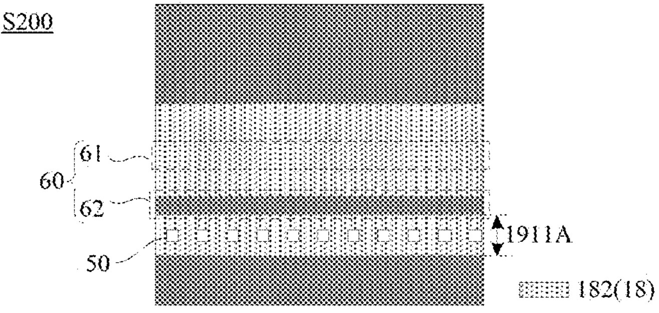
Figure 18:
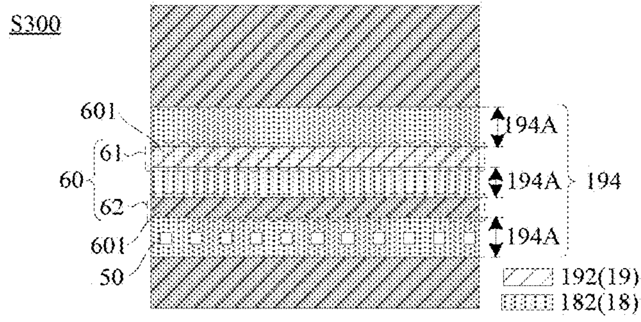
Figure 18:
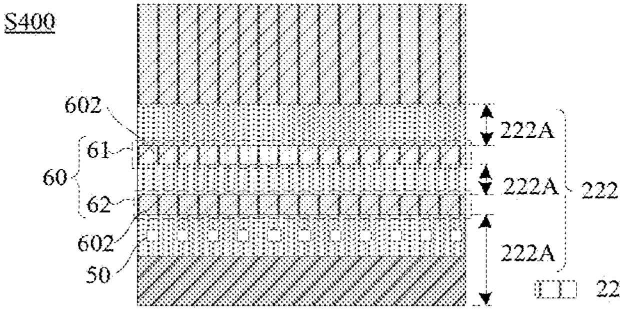

Some embodiments of the present disclosure provide a method for manufacturing the display panel 100. Taking the display panel 100 shown in FIG. 2A as an example, the display panel 100 includes a first planarization layer 191 and a second planarization layer 192 (i.e., the planarization layer 19). With reference to FIG. 18, the method includes S100 to S400.

In S100, the first planarization layer 191 is formed.

The first planarization layer 191 includes a second opening 1911. In a case where the retaining wall structure 60 includes the fourth spacer block 604 located in the first planarization layer 191, the fourth spacer block 604 divides the second opening 1911 into two second sub-openings 1911A.

In S200, a first metal layer 18 is formed on a side of the first planarization layer 191 away from the substrate 11.

The first metal layer 18 includes at least one through hole 50 (a plurality of through holes 50 are shown in FIG. 18), and the orthogonal projection of the through hole 50 on the first planarization layer 191 is located in the second opening 1911.

In S300, a second planarization layer 192 is formed on a side of the first metal layer 18 away from the first planarization layer 191.

The second planarization layer 192 includes an opening 194. In a case where the first retaining wall 61 and the second retaining wall 62 each include the first spacer block 601 made of the same material and arranged in the same layer as the second planarization layer 192, the first spacer block 601 divides the opening 194 into a plurality of sub-openings 194A. At least one of the sub-openings 194A exposes at least one through hole 50. That is, an orthogonal projection of the sub-opening 194A on a plane where the first planarization layer 191 is located covers an orthogonal projection of the at least one through hole 50 on the plane where the first planarization layer 191 is located.

In S400, a pixel defining layer 22 is formed on a side of the second planarization layer 192 away from the first metal layer 18.

The pixel defining layer 22 includes a third opening 222. In a case where the first retaining wall 61 and the second retaining wall 62 each include the second spacer block 602 made of the same material and arranged in the same layer as the pixel defining layer 22, the second spacer block 602 divides the third opening 222 into a plurality of third sub-openings 222A.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, having a display region and a peripheral region surrounding the display region;
- the display panel comprising:
- a substrate;
- a first metal layer disposed on the substrate, the first metal layer including a signal line pattern located in the peripheral region;
- a planarization layer disposed on a side of the first metal layer away from the substrate, the planarization layer including at least one opening located in the peripheral region; and
- a retaining wall structure located in the peripheral region and surrounding the display region, at least a portion of the retaining wall structure being located in the at least one opening, wherein
- the signal line pattern includes one or more through holes, an orthogonal projection of the one or more through holes on the substrate is located within an orthogonal projection of the opening on the substrate, and is located on at least one of a side of an orthogonal projection of the retaining wall structure on the substrate proximate to the display region or a side of the orthogonal projection of the retaining wall structure on the substrate away from the display region.

2. The display panel according to claim 1, wherein the signal line pattern includes a plurality of through holes, the plurality of through holes are arranged in one or more rows, and multiple through holes in a row are distributed in an extension direction of the portion of the retaining wall structure located in the opening at intervals.

3. The display panel according to claim 2, wherein at least one row of the one or more rows of through holes are disposed on a side of the retaining wall structure proximate to the display region; and/or at least one row of the one or more rows of through holes are disposed on a side of the retaining wall structure away from the display region.

4. The display panel according to claim 2, wherein the plurality of through holes are arranged in a plurality of rows, and in a direction perpendicular to an arrangement direction of a row of through holes, any two adjacent rows of through holes are distributed at intervals.

5. The display panel according to claim 1, wherein the opening includes a first edge and a second edge opposite to each other, the first edge is located on a side of the retaining wall structure proximate to the display region, and the second edge is located on a side of the retaining wall structure away from the display region;

at least one through hole in the one or more through holes is disposed between the retaining wall structure and the first edge; and at least one through hole in the one or more through holes is disposed between the retaining wall structure and the second edge.

6. The display panel according to claim 5, wherein a distance between the retaining wall structure and the first edge is smaller than a distance between the retaining wall structure and the second edge.

7. The display panel according to claim 5, wherein a distance between the at least one through hole, provided between the retaining wall structure and the first edge, and the retaining wall structure is in a range of 11 μm to 40 μm, inclusive; and/or a distance between the at least one through hole, provided between the retaining wall structure and the second edge, and the retaining wall structure is in a range of 11 μm to 75 μm, inclusive.

8. The display panel according to claim 1, wherein the opening includes a first edge and a second edge, the first edge is located on a side of the retaining wall structure proximate to the display region, and the second edge is located on a side of the retaining wall structure away from the display region;

at least one through hole in the one or more through holes is disposed between the retaining wall structure and the first edge, and a minimum distance between the at least one through hole and the first edge is approximately equal to a minimum distance between the through hole and the retaining wall structure; and/or at least one through hole in the one or more through holes is disposed between the retaining wall structure and the second edge, and a minimum distance between the at least one through hole and the second edge is approximately equal to a minimum distance between the through hole and the retaining wall structure.

9. The display panel according to claim 1, wherein a shape of an orthogonal projection of a through hole on the substrate includes a circle or a rectangle.

10. The display panel according to claim 1, wherein an area of a sidewall of each through hole in the one or more through holes is in a range of 40 $\mu m^2$ to 100 $\mu m^2$, inclusive.

11. The display panel according to claim 10, wherein the sidewall of each through hole includes an undercut, a bottom wall of the undercut is substantially arc-shaped, and a maximum distance between a lowest point of the bottom wall and the sidewall of the through hole is inversely related to a number of the one or more through holes.

12. The display panel according to claim 11, wherein the opening includes a first edge and a second edge opposite to each other, the first edge is located on a side of the retaining wall structure proximate to the display region, and the second edge is located on a side of the retaining wall structure away from the display region;

at least one first through hole in the one or more through holes is disposed between the retaining wall structure and the first edge, and at least one second through hole in the one or more through holes is disposed between the retaining wall structure and the second edge;

a number of the at least one first through hole is less than a number of the at least one second through hole, and an average depth of an undercut in a sidewall of a first through hole is less than an average depth of an undercut in a sidewall of a second through hole; or the number of the at least one second through hole is less than the number of the at least one first through hole, and the average depth of the undercut in the sidewall of the second through hole is less than the average depth of the undercut in the sidewall of the first through hole; or the number of the at least one first through hole is equal to the number of the at least one second through hole, and the average depth of the undercut in the sidewall of the first through hole is approximately equal to the average depth of the undercut in the sidewall of the second through hole.

13. The display panel according to claim 1, wherein the first metal layer includes at least one voltage signal line, a portion of the at least one voltage signal line is disposed in the peripheral region and located in the at least one opening, and the one or more through holes are disposed in the portion of the at least one voltage signal line located in the peripheral region and located in the at least one opening.

14. The display panel according to claim 13, wherein the peripheral region includes a fan-out area located on a side of the display region, and a bonding area located on a side of the fan-out area away from the display region; the at least one voltage signal line includes:

a first voltage signal line including a plurality of first sub-lines disposed in the display region, a first bus located in the fan-out area, and a first connection line extending from the fan-out area to the bonding area; ends of the plurality of first sub-lines proximate to the fan-out area being electrically connected to the first bus, and the first bus being electrically connected to the first connection line; and a second voltage signal line including a second sub-line disposed in the peripheral region and at least partially surrounding the display region, at least one second bus located in the fan-out area, and at least one second connection line extending from the fan-out area to the bonding area; both ends of the second sub-line extending to the fan-out area and being electrically connected to the at least one second bus, and the at least one second bus being electrically connected to the at least one second connection line; wherein the first bus and the at least one second bus extend in a first direction, and the first direction is an extension direction of a side edge of the display region where the fan-out area is located; the signal line pattern includes the first bus and the at least one second bus, and the one or more through holes are disposed in the first bus and/or the at least one second bus.

15. The display panel according to claim 14, wherein multiple through holes are disposed in the first bus, and the multiple through holes are arranged in a row in the first direction.

16. The display panel according to claim 14, wherein the second voltage signal line includes two second buses that are located on both sides of the fan-out area; each second bus is electrically connected to an end of the second sub-line extending to a same side of the fan-out area as the second bus; and multiple through holes are disposed in at least one second bus, and the multiple through holes are arranged in a row in the first direction.

17. The display panel according to claim 1, wherein the first metal layer includes a metal titanium layer, a metal aluminum layer and a metal titanium layer that are stacked in sequence.

18. The display panel according to claim 1, wherein the retaining wall structure includes a first retaining wall and a second retaining wall that are disposed at intervals, and the first retaining wall is closer to the display region than the second retaining wall, wherein the one or more through holes are disposed on a side of the first retaining wall proximate to the display region and/or on a side of the second retaining wall away from the display region.

19. The display panel according to claim 18, wherein the first retaining wall and the second retaining wall each include a spacer block, and the spacer block is located in the planarization layer.

20. A display apparatus, characterized by comprising the display panel according to claim 1.

* * * * *